(12) United States Patent
Bao et al.

(10) Patent No.: US 12,176,348 B2
(45) Date of Patent: Dec. 24, 2024

(54) SELF-ALIGNED HYBRID SUBSTRATE STACKED GATE-ALL-AROUND TRANSISTORS

(71) Applicant: International Business Machines Corporation, Armonk, NY (US)

(72) Inventors: Ruqiang Bao, Niskayuna, NY (US); Junli Wang, Slingerlands, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 486 days.

(21) Appl. No.: 17/538,559

(22) Filed: Nov. 30, 2021

(65) Prior Publication Data
US 2023/0170352 A1   Jun. 1, 2023

(51) Int. Cl.
*H01L 27/12*   (2006.01)
*H01L 21/02*   (2006.01)
(Continued)

(52) U.S. Cl.
CPC ...... *H01L 27/0922* (2013.01); *H01L 21/0259* (2013.01); *H01L 21/02609* (2013.01);
(Continued)

(58) Field of Classification Search
CPC ............. H01L 27/0922; H01L 21/0259; H01L 21/02609; H01L 21/823807;
(Continued)

(56) References Cited

U.S. PATENT DOCUMENTS 5,384,473 A   1/1995   Yoshikawa et al.
7,422,956 B2   9/2008   Waite et al.
(Continued)

FOREIGN PATENT DOCUMENTS

EP     3588546 A1    1/2020
TW   202139365 A   10/2021

OTHER PUBLICATIONS

Patent Rejection Decision dated Aug. 2, 2023 issued in Taiwan Application No. 111128727, 30 pages.
(Continued)

*Primary Examiner* — Niki H Nguyen
(74) *Attorney, Agent, or Firm* — Scully, Scott, Murphy & Presser, P.C.; Samuel A. Waldbaum

(57) ABSTRACT

A semiconductor structure including vertically stacked nFETs and pFETs containing suspended semiconductor channel material nanosheets (NS) and a method of forming such a structure. The structure is a three dimensional (3D) integration by vertically stacking nFETs and pFETs for area scaling. In an embodiment, vertically-stacked NS FET structures include a first nanosheet transistor located above a second nanosheet transistor; the first nanosheet transistor including a first NS channel material, wherein the first NS channel material includes a first crystalline orientation; the second nanosheet transistor including a second NS channel material, wherein the second NS channel material comprises a second crystalline orientation, the first crystalline orientation is different from the second crystalline orientation. In an embodiment, each of the respective formed vertically-stacked NS FET structures include respective suspended stack of nanosheet channels that are self-aligned with each other.

24 Claims, 12 Drawing Sheets

(51) Int. Cl.
*H01L 21/8238* (2006.01)
*H01L 27/092* (2006.01)
*H01L 29/04* (2006.01)
*H01L 29/06* (2006.01)
*H01L 29/423* (2006.01)
*H01L 29/66* (2006.01)
*H01L 29/786* (2006.01)

(52) U.S. Cl.
CPC ............... *H01L 21/823807* (2013.01); *H01L 21/823814* (2013.01); *H01L 21/823842* (2013.01); *H01L 29/045* (2013.01); *H01L 29/0665* (2013.01); *H01L 29/42392* (2013.01); *H01L 29/66545* (2013.01); *H01L 29/66742* (2013.01); *H01L 29/78696* (2013.01)

(58) Field of Classification Search
CPC ..... H01L 21/823814; H01L 21/829842; H01L 29/045; H01L 29/0665; H01L 219/42392; H01L 29/66545; H01L 29/66742; H01L 29/78696; H01L 29/513; H01L 27/0886; H01L 29/785; H01L 29/0847; H01L 29/41758; H01L 29/66666; H01L 29/7827; H01L 33/0075; H01L 33/0025; H01L 29/42392; H01L 29/66439; H01L 21/76897; H01L 29/0669; H01L 21/76251; H01L 21/8221; H01L 21/823412; H01L 21/02603; H01L 25/0657; H01L 24/06; H01L 29/4908; H01L 27/1211; H01L 29/7831; H10B 12/056; H10B 12/36
See application file for complete search history.

(56) References Cited

U.S. PATENT DOCUMENTS

| | | | |
|---|---|---|---|
| 7,432,149 | B2 | 10/2008 | Wu et al. |
| 7,863,712 | B2 | 1/2011 | Yin et al. |
| 10,658,462 | B2 | 5/2020 | Lee et al. |
| 10,741,456 | B2 | 8/2020 | Cheng et al. |
| 10,748,994 | B2 | 8/2020 | Reznicek et al. |
| 10,879,352 | B2 | 12/2020 | Zhang et al. |
| 10,896,851 | B2 | 1/2021 | Cheng et al. |
| 2015/0014789 | A1 | 1/2015 | Xiong et al. |
| 2017/0040321 | A1* | 2/2017 | Mitard ............. H01L 29/78684 |
| 2017/0062506 | A1* | 3/2017 | Saito ................ H01L 21/30608 |
| 2019/0348530 | A1 | 11/2019 | Ando et al. |
| 2020/0098756 | A1 | 3/2020 | Lilak et al. |
| 2020/0194569 | A1 | 6/2020 | Wang et al. |
| 2020/0266218 | A1* | 8/2020 | Lilak ............... H01L 21/823437 |
| 2020/0295127 | A1* | 9/2020 | Mannebach .......... H01L 29/401 |
| 2021/0098605 | A1 | 4/2021 | Wang et al. |
| 2021/0265349 | A1 | 8/2021 | Chung et al. |
| 2021/0351078 | A1 | 11/2021 | Lilak et al. |
| 2022/0122892 | A1 | 4/2022 | Smith et al. |

OTHER PUBLICATIONS

International Search Report dated Feb. 16, 2023 issued in PCT/EP2022/080810, 19 pages.

Xue, L., et al., "Three-Dimensional Integration: Technology, Use, and Issues for Mixed-Signal Applications", IEEE Transactions on Electron Devices, Mar. 2003, pp. 601-609, vol. 50, No. 3.

* cited by examiner

SELF-ALIGNED HYBRID SUBSTRATE STACKED GATE-ALL-AROUND TRANSISTORS

BACKGROUND

The present application relates to a semiconductor structure and a method of forming the same. More particularly, the present application relates to a semiconductor structure including self-aligned vertically stacked gate-all-around (GAA) transistors structure on different substrate crystallization structures, and a method of forming the same.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

One current design incorporates separate co-planar nFETs and pFETs and nanosheets on hybrid substrates (substrates having different crystal orientations).

SUMMARY

In one aspect there is provided a vertically stacked gate-all-around (GAA) semiconductor device. The vertically stacked gate-all-around (GAA) semiconductor device comprises a first FET GAA device having a first vertical stack of spaced apart nanosheet (NS) channels surrounded by a first gate structure, the first vertical stack of spaced apart nanosheet channels comprising a first channel material of a first crystalline orientation. The vertically stacked gate-all-around (GAA) semiconductor device further comprises a second FET GAA device having a second vertical stack of spaced apart nanosheet channels surrounded by a second gate structure, the second FET GAA device stacked vertically on top the first FET GAA device, the second vertical stack of spaced apart nanosheet channels comprising a second channel material of a second crystalline orientation and the first crystalline orientation is different from the second crystalline orientation.

The vertically stacked gate-all-around (GAA) semiconductor device structure including nanosheets on a nanosheet stackFET provides easier integration, e.g., easy cell alignment for top transistor and bottom transistors.

In an embodiment, the second vertical stack of spaced apart nanosheet channels have sidewalls self-aligned to sidewalls of the first vertical stack of spaced apart nanosheet channels.

In one aspect, the vertically stacked gate-all-around GAA semiconductor device further comprises an insulator material bonding layer disposed between the first gate structure and the second gate structure.

In one aspect there is provided a vertically stacked gate-all-around (GAA) semiconductor device. The vertically stacked gate-all-around (GAA) semiconductor device comprises a first FET GAA device having a first vertical stack of spaced apart nanosheet channels surrounded by a first gate, the first vertical stack of nanosheet channels comprising a first channel material where the first channel material comprises a first crystalline orientation and an insulator material bonding layer disposed above the first gate. The GAA semiconductor device further includes a second FET GAA device having a second vertical stack of nanosheet channels surrounded by a second gate, the second FET GAA device formed on top the insulator material bonding layer, the second vertical stack of nanosheet channels comprising a second channel material where the second channel material comprises a second crystalline orientation and the first crystalline orientation is different from the second crystalline orientation.

The vertically stacked gate-all-around (GAA) semiconductor device structure including nanosheet channels on a nanosheet stackFET provides easier integration, e.g., easy cell alignment for top transistor and bottom transistors.

Further, in an embodiment, the first FET GAA device of the vertically stacked gate-all-around GAA semiconductor device is an nFET GAA device, the crystalline orientation of the nFET GAA device being a (100) dominant plane and a (110) sidewall orientation; and the second FET GAA device is an pFET GAA device, the crystalline orientation of the pFET GAA device being a (110) dominant plane and a (100) sidewall orientation.

Alternately, the first FET GAA device is a pFET GAA device, the crystalline orientation of the pFET GAA device is a (110) dominant plane and a (100) sidewall orientation; and the second FET GAA device is an nFET GAA device, the crystalline orientation of the nFET GAA device is a (100) dominant plane and a (110) sidewall orientation.

In a further aspect, there is provided a method of forming a vertically stacked gate-all-around (GAA) semiconductor device. The method comprises a forming on a first wafer with a first crystal orientation a first layered material structure for forming a first vertical stack of spaced apart nanosheet channel material layers. The method further includes forming on a second wafer with a second crystal orientation a second layered material structure for forming a second vertical stack of spaced apart nanosheet channels. Then the first wafer is bonded to the second wafer to form a bonded wafer. The method then includes building a first GAA transistor device including the first vertical stack of spaced apart nanosheet channel material layers surrounded by a first gate structure, a flipping of the bonded wafer, and a building of a second GAA transistor device including the second vertical stack of spaced apart nanosheet channel material layers surrounded by a second gate structure.

The method(s) of manufacturing the vertical stacked gate-all-around semiconductor FET transistor structure and replacement metal gate stacked FET advantageously solves the problem of integrating nanosheet channels on nanosheet channels for high performance applications.

In still a further aspect, there is provided a method of forming a vertically stacked gate-all-around (GAA) semiconductor device. The method comprises a bonding of a first semiconductor wafer to a second semiconductor wafer. There is performed a building, on the bonded first wafer, a first FET GAA device having a first vertical stack of spaced apart nanosheet channels surrounded by a first gate, the first vertical stack of spaced apart nanosheet channels comprising a first channel material where the first channel material comprises a first crystalline orientation. There is then performed a flipping of the bonded first wafer and second wafer and then a building on the bonded second wafer, a second FET GAA device having a second vertical stack of nanosheet channels surrounded by a second gate. The second vertical stack of spaced apart nanosheet channels comprise a second channel material where the second channel material comprises a second crystalline orientation and the first crystalline orientation is different from the second crystalline orientation.

The method(s) of manufacturing the vertical stacked gate-all-around semiconductor FET transistor structure and replacement metal gate stacked FET advantageously solves the problem of integrating nanosheet channels on nanosheet channels for high performance applications.

In an embodiment, the second vertical stack of spaced apart nanosheet channels have sidewalls self-aligned to sidewalls of the first vertical stack of spaced apart nanosheet channels.

Advantageously, the structure and methods herein provide a high mobility hybrid scheme for gate all around (GAA) for both nFET and pFET which reduces the process integration complexity as well as provide EUV option to print the nanosheets for both nFET and pFET making integration easier.

Further, the use of 110 pFET NS and 100 nFET NS forming a stackFET enables high performance, e.g., increased carrier mobility. The structure including nanosheets on a nanosheet stackFET provides easier integration, i.e., easy standard cell alignment for top transistor and bottom transistors.

DETAILED DESCRIPTION

Figure 1:
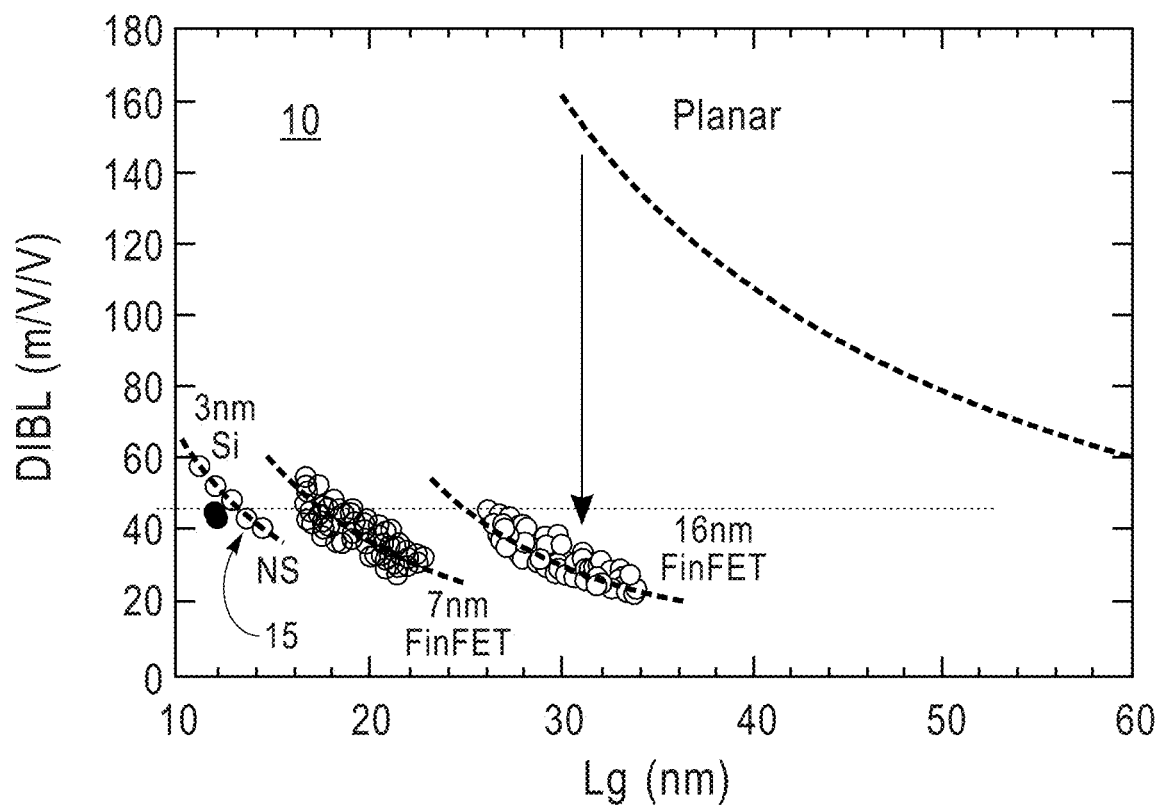
FIG. 1 depicts a plot showing the improved performance characteristic using a nanosheet (NS) FET for stackFET as compared to FINFET due to the reduced gate length scaling for a fixed DIB (drain induced barrier lowering)

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present disclosure provides a vertical stacked gate-all-around semiconductor FET transistor structure and replacement metal gate stacked FETs having, in an embodiment, an integrated nanosheet bottom transistor and nanosheet top transistor, where one integrated nanosheet is a pFET having a (110) dominant plane substrate and another nanosheet is a nFET having a (100) dominant plane substrate. The structure including nanosheets on a nanosheet stackFET provides easier integration, e.g., easy standard cell alignment for top transistor and bottom transistors.

The method(s) of manufacturing the vertical stacked gate-all-around semiconductor FET transistor structure and replacement metal gate stacked FET solves the problem of integrating nanosheet on nanosheet for high performance applications since a 110 nanosheet pFET provides better performance, e.g., increased carrier mobility, than a 100 nanosheet pFET and/or FinFET pFET due to substrate orientation or more effective transistor width (Weff) as compared to FinFETs.

FIG. 1 depicts a plot 10 showing the improved performance characteristic using a nanosheet (NS) FET 12 on an order of 3 nm dimension as compared to different larger sized FINFETs 15 due to the reduced gate length scaling for a fixed DIBL (drain induced barrier lowering). However, the <110> crystal orientation of (100) plane pFET NS has reduced mobility due to substrate orientation. Therefore, the present disclosure describes a NS stackFET structure that improves the mobility.

Figure 2A:
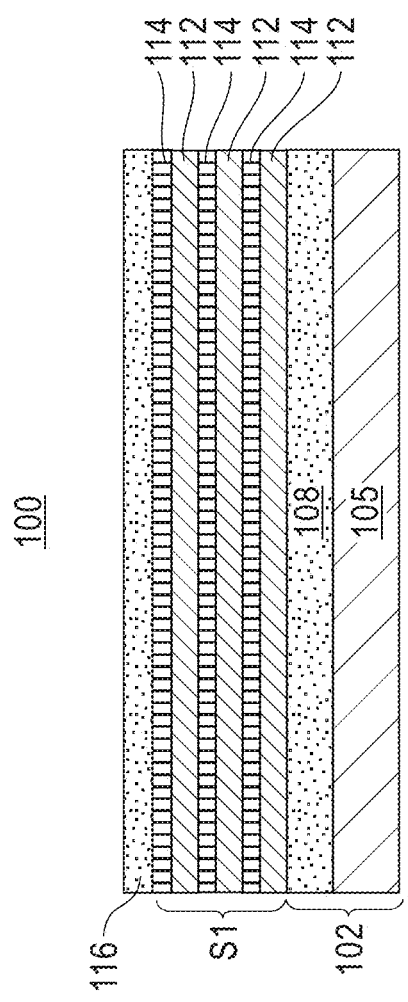
FIG. 2A illustrates a cross sectional view of a first semiconductor wafer having an exemplary semiconductor structure of a first crystalline orientation at an early stage of fabrication.

Referring to FIG. 2A, there is illustrated an exemplary semiconductor structure at an early stage of fabrication in accordance with an embodiment of the present application. Notably, the exemplary semiconductor structure of FIG. 2A is built on a first wafer 100. The first wafer 100 is a Silicon-on-Insulator (SOI) wafer including a SOI substrate structure 102 having handle substrate 105, a first buried insulator layer (e.g., a buried oxide) 108 formed on top substrate 105, and a semiconductor material layer 112 above insulator layer 108. First wafer 100 is of a first crystalline orientation. In an embodiment, the first wafer 100 is of a (100) surface for forming an nFET GAA nanosheet device. With more particularity, for nFET NS, it is (100) dominant plane with a (110) sidewall. The substrate could be Si or other high mobility channel material like GaAs.

Formed on the buried insulator layer of the SOI substrate of the first wafer 100 is a first semiconductor material nanosheet (NS) stack, S1, of alternating layers of a semiconductor material layer 112 and a sacrificial semiconductor channel material layer 114. In the embodiment depicted, the NS stack S1 of alternating semiconductor material layers 112 and sacrificial semiconductor channel material layers 114 are formed atop a top insulating dielectric (buried oxide)

layer 108 formed above the substrate 105. The alternating semiconductor material layers 112 are also formed of a (100) dominant plane crystalline orientation.

Figure 2B:
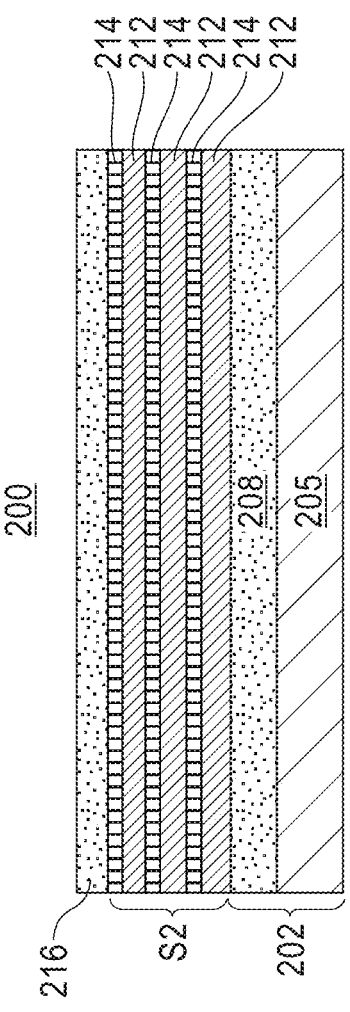
FIG. 2B illustrates a cross sectional view of a second semiconductor wafer having an exemplary semiconductor structure of a second crystalline orientation at an early stage of fabrication in accordance with embodiments of the present application.

Referring to FIG. 2B, there is illustrated an additional semiconductor structure formed at an early stage of fabrication in accordance with an embodiment of the present application. Notably, the exemplary second semiconductor structure of FIG. 2B is built on a second SOI wafer 200 including a SOI substrate structure 202 having handle substrate 205, a first buried insulator layer (e.g., buried oxide) 208 formed on top substrate 205, and a semiconductor material layer 212 above insulator layer 208. Second wafer 120 is of a second crystalline orientation. In an embodiment, the second wafer 200 is of a (100) surface crystalline orientation for forming a pFET GAA nanosheet (NS) channel device. With more particularity, for the pFET NS, it is (100) dominant plane crystalline orientation with a (100) sidewall. The substrate could be Si or SiGe or other semiconductor materials. In an embodiment, the pFET nanosheet device is formed to include nanosheet channels that are either self-aligned with the nanosheet channels of the formed nFET or non-self-aligned nanosheet channels.

Formed on the buried insulator layer of the SOI substrate of the second wafer 200 is a second semiconductor material NS stack, S2, of alternating layers of a semiconductor material layer 212 and a sacrificial semiconductor channel material layer 214, wherein the second semiconductor material NS stack, S2, is formed on a topmost surface of the insulating dielectric (buried oxide) layer 208 formed above the substrate 205. The alternating semiconductor material layers 212 are also formed of a (100) dominant plane crystalline orientation.

In embodiments, each semiconductor-on-insulator handle substrate 105, 205 provides mechanical support for the overlying buried insulator layer 108, 208, top semiconductor material layers 112, 212 and respective stacks S1, S2. The semiconductor substrate 105, 205 may include any semiconductor material including, for example, silicon. The term "semiconductor material" is used throughout the present application to denote a material that has semiconducting properties. Besides silicon, the semiconductor material may be germanium (Ge), a silicon germanium alloy (SiGe), silicon carbide (SiC), silicon germanium carbide (SiGeC), III-V compound semiconductors or II-VI compound semiconductors such as GaN, GaAs, InP, and InAs, etc.

The insulator layer 108, 208, which in some embodiments may be referred to as a buried insulator layer, may be a crystalline, or non-crystalline, oxide or nitride. In one embodiment, the insulator layer is an oxide such as, for example, silicon dioxide.

In an embodiment, rather than an SOI substrate, both wafers 100, 200 may comprise a bulk Si substrate upon which each second semiconductor material stack, S1, S2, is formed. However, when using a bulk Si substrate, an etch stop layer is formed to replace the oxide in SOI to prepare the substrate. In an embodiment, the etch stop layer replacing the buried oxide layer of an SOI substrate can be a layer of SiGe functioning as an etch stop.

On each wafer 100, 200, the respective first and second semiconductor material stacks (S1, S2) are then sequentially formed upon the SOI semiconductor substrate semiconductor material layers 112, 212. As mentioned above, the respective first and second semiconductor material stacks (S1, S2) include respective semiconductor material layers 112, 212 and respective sacrificial semiconductor channel material layers 114, 214 which alternate one atop the other. Each of the first and second semiconductor material stacks (S1, S2) can be formed by sequential epitaxial growth of alternating layers of the first semiconductor material and the sacrificial semiconductor material. In each of FIGS. 2A, 2B, and by way of one example, each of the respective first and second semiconductor material stacks (S1, S2) includes three alternating layers of semiconductor material layers (112, 212) and sacrificial semiconductor channel material layers (114, 214). The first and second semiconductor material stacks (S1, S2) that can be employed in the present application are not limited to the specific embodiment illustrated in the figures. Instead, the first and second semiconductor material stacks (S1, S2) can include any number of semiconductor material layers (112, 212) and corresponding sacrificial semiconductor channel material layers (114, 214) so long as each of the first and second semiconductor material stacks (S1, S2) includes at least two semiconductor material layers 112, 212 alternating with two sacrificial semiconductor channel material layers 114, 214.

Each semiconductor material layer 112, 212 is composed of a semiconductor material which may be the same or differ in composition from the semiconductor handle substrate 105, 205. In one embodiment, the semiconductor substrate 105, 205 is composed of silicon, while each semiconductor material layer 112,212 is also composed of silicon. In such an embodiment, sacrificial semiconductor material layers 114, 214 can be a SiGe alloy. In embodiments, each semiconductor material layer 112, 212 can be composed of a silicon germanium alloy and the sacrificial semiconductor material layers 114, 214 can be Si. In embodiments, the SiGe alloy providing the sacrificial/semiconductor material layer has a germanium content that is less than 75 atomic percent germanium. In one example, the SiGe alloy that provides each sacrificial/semiconductor material layer has a germanium content from 20 atomic percent germanium to 40 atomic percent germanium. The first semiconductor material that provides each semiconductor material layer 112, 212 can be formed utilizing an epitaxial growth (or deposition process) as defined in greater detail herein below.

In embodiments, each sacrificial semiconductor channel material layer 114, 214 is composed of a second semiconductor material that has a different etch rate than (is different from) the first semiconductor material that provides the semiconductor material layers 112, 212.

In a further example, the sacrificial semiconductor channel material layer 114, 214 is composed of Si or a III-V compound semiconductor, while each semiconductor material layer 112, 212 is composed of a silicon germanium alloy. The second semiconductor material that provides each sacrificial semiconductor channel material layer 114, 214 can be formed utilizing an epitaxial growth (or deposition process) as defined in greater detail herein below.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growths described herein can be performed utilizing any well known precursor gas or gas mixture. Carrier gases like hydrogen, nitrogen, helium and argon can be used.

Each semiconductor material layer 112, 212 may have a thickness ranging from between 5 nm to 12 nm, while each sacrificial semiconductor channel material layer 114, 214 may also have a thickness from 3 nm to 12 nm. In an embodiment, the bottommost sacrificial semiconductor material layer 214 in the second semiconductor material stack, S2, has a thickness that is generally greater than the thickness of the other sacrificial semiconductor material layers within the first and second semiconductor material stacks (S1, S2).

In further view of FIG. 2A, a top insulating hardmask (HM) bonding layer 116 is deposited upon the top semiconductor channel material layer 114, and as shown in FIG. 2B, a top insulating hardmask bonding layer 216 is deposited upon the top semiconductor channel material layer 214. These top insulating layers 116, 216 can comprise an oxide, e.g., $SiO_2$, or an oxyitride and can be deposited to a thickness ranging between 5 nm and 100 nm.

FIGS. 3A-3D depict method steps for forming a vertically stacked CMOS (pFET NS GAA/nFET NS GAA) structure according to a first embodiment. This vertically stacked CMOS (pFET NS/nFET NS) structure includes a top NS nFET and bottom NS pFET that are connected by insulators vertically. In the first embodiment, the insulators are uniformly connected across wafer or chips by one layer or multi-layers and the NS channel layers of the active devices are not self-aligned.

Figure 3A:
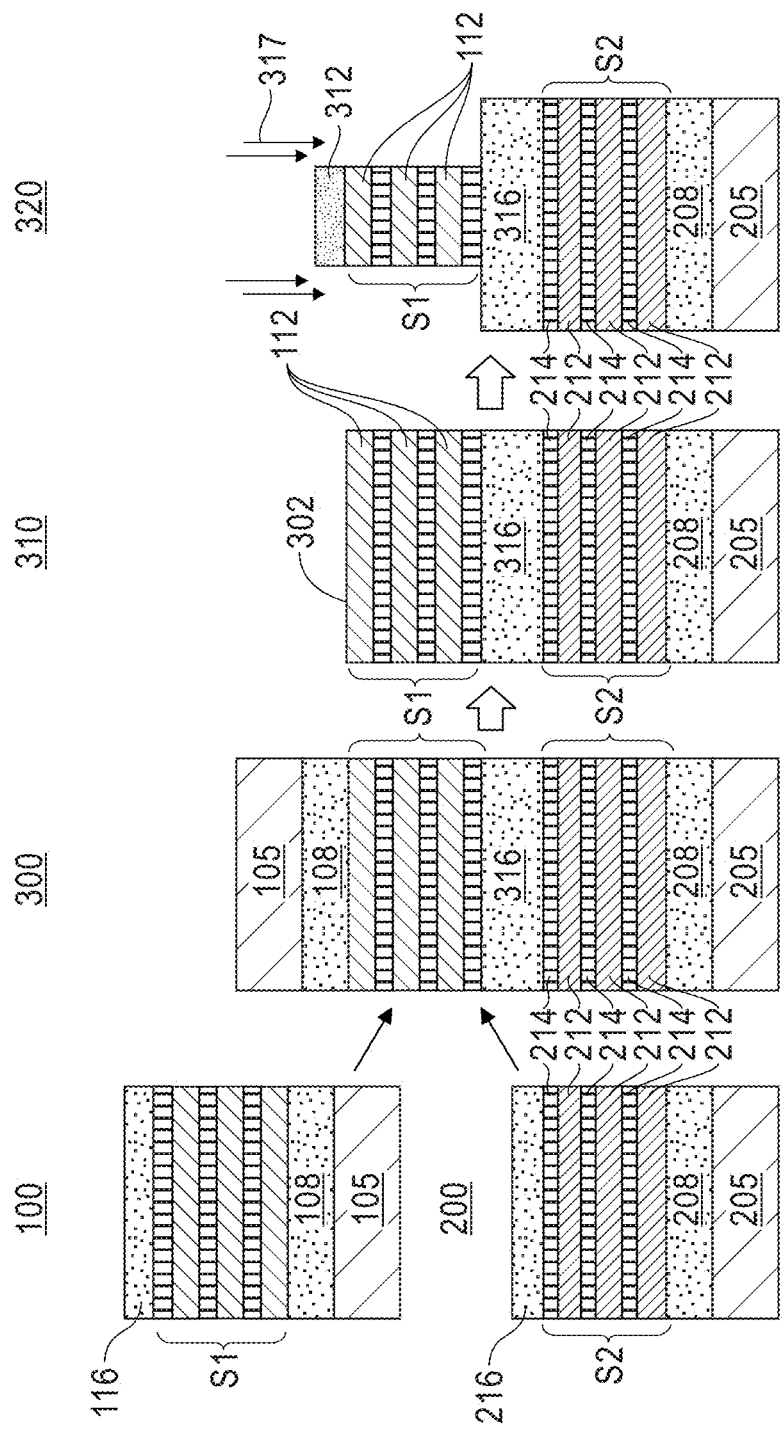
FIGS. 3A-3D depict method steps for forming a vertically stacked CMOS (pFET NS GAA/nFET NS GAA) structure according to a first embodiment.

In view of FIG. 3A, there is depicted a series of processing steps resulting in further intermediate structures according to a first embodiment. Initially, as shown in FIG. 3A, an initial structure 300 is formed resulting from a bonding of the first wafer 100 having NS stack S1 with the second wafer 200 to result in a stacked wafer structure. In particular, the structure 300 shown in FIG. 3A results from a flipping of the first wafer 100 having <100> SOI orientation with a NS stack S1/Oxide HM layer 116 and bonding it to the HM layer 216 of the second wafer having the <110> SOI with a NS stack S2. This first wafer 100 is flipped and the top insulating bonding material layer 116 is bonded to the top insulating bonding material layer surface 216 of the second wafer 200 to form a bonded dielectric material layer 316.

FIG. 3A further depicts a further resulting structure 310 after performing a further step of removing the top wafer substrate 105 and box oxide layer (SOI) 108 removal of the first wafer 100 according to the first embodiment. In an embodiment, a series of etching and/or chemical-mechanical planarizing (CMP) steps can be performed to remove top wafer substrate layer 105 and underlying BOX layer 108 and expose a top surface 302 of the underlying alternating layered NS stack S1.

FIG. 3A further depicts a further structure 320 resulting after performing a process which includes lithographic patterning and etching processes to provide the first semiconductor material NS stack S1 for a GAA nFET device. The lithographic step can include forming a photoresist (not shown) atop a hard mask 312 deposited upon top of surface 302, exposing the photoresist to a desired pattern of radiation and then developing the exposed photoresist utilizing a conventional resist developer. The pattern within the photoresist is then transferred through the hard mask 312 and into the underlying alternating layer nanosheet stack S1. A single etch or multiple etching 317 can be used to provide the resulting structure 320 illustrated in FIG. 3A. The etch or multiple etch 317 can include a dry etch process, a chemical wet etch process, or any combination thereof. When a dry etch is used, the dry etch can be a reactive ion etch process, a plasma etch process, ion beam etching or laser ablation. The patterned photoresist material can be removed any time after transferring the pattern into at least the hard mask utilizing a conventional stripping process. As a result of performing lithographic patterning and etching the width of the stack of multiple, horizontal stacked nanosheet channel layers (S1) is defined for forming the gate all-around FET structure of the top NS FET (nanosheet FET) according to the first embodiment.

Figure 3B:
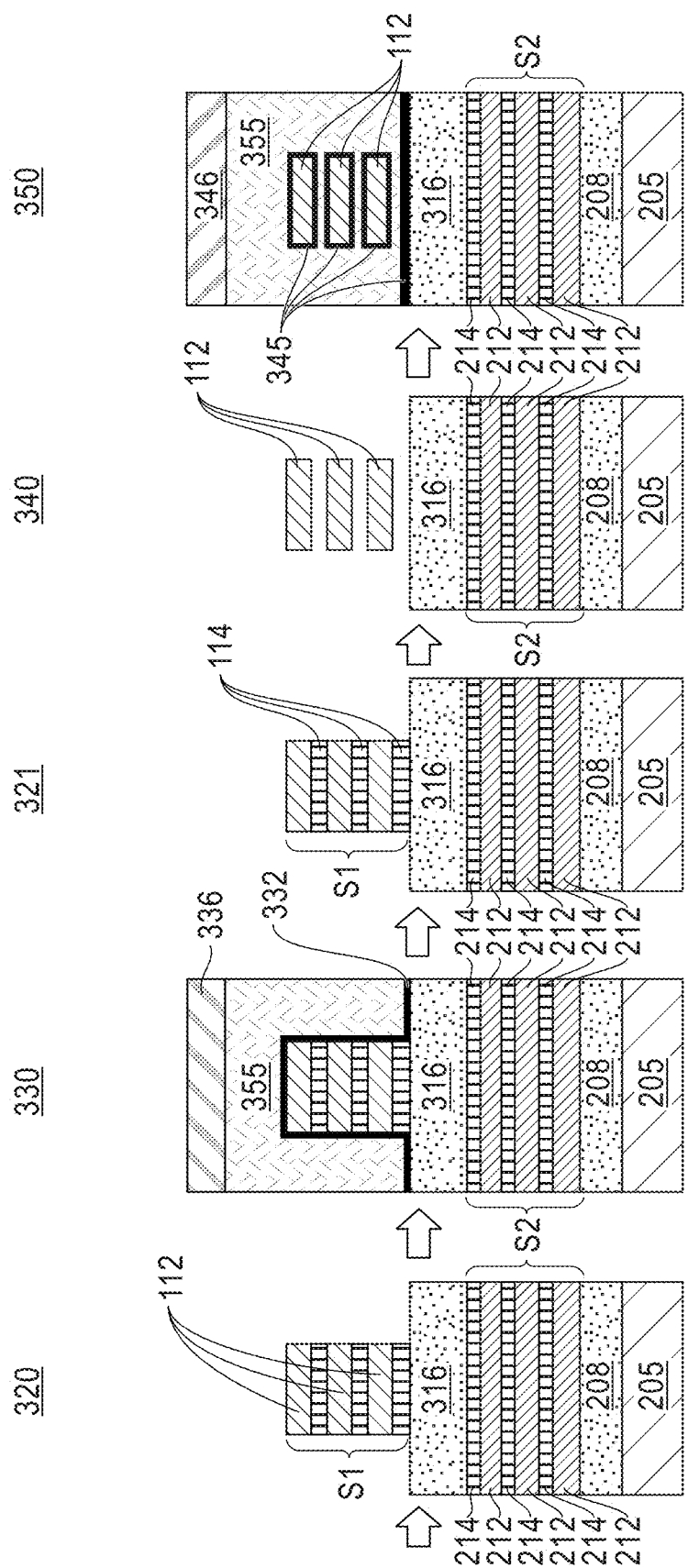

FIG. 3B depicts further resulting structures after performing steps for forming the top nFET nanosheet device. As shown in FIG. 3B, from the resulting intermediate structure 320, a conventional replacement metal gate (RMG) process flow is performed. That is, upon exposed top and sidewall surfaces of the etched NS stack S1 and exposed top surface of the insulating bonding layer 316 there is first formed, from bottom to top: a thin blanket sacrificial (dummy) gate dielectric material layer 332 ranging from a thickness between 1 nm to 5 nm spanning and surrounding the stack S1 of multiple, horizontal stacked nano-sheet channel layers, a sacrificial metal gate layer 335, and a top sacrificial gate dielectric material cap layer 336. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition. Upon the dummy gate dielectric material layer 332 is then formed a sacrificial (dummy) metal gate structure 335 surrounding the stack S1 of multiple, horizontal stacked nano-sheet channel layers. The sacrificial dummy gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. Further deposited and formed are respective nFET source and drain regions (not shown) on respective opposite sides of the NS channel layers. Upon the top of the dummy gate 335 there is formed a top sacrificial gate dielectric material cap layer 336. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

As further shown in FIG. 3B, there is depicted a further structure 321 resulting from process steps performed to remove dummy gate to expose the multiple, horizontal stacked nano-sheet semiconductor (e.g., Si) channel layers 112.

After dummy gate removal, a "channel release" step is performed in the standard replacement gate integration using vapor phase HCl to remove the sacrificial semiconductor material layers 114 from the multiple, horizontal stacked nano-sheet stack S1. In an embodiment, the channel release step results in the structure 340 shown in FIG. 3B that provides suspended, vertically spaced apart semiconductor nanosheets (channels) 112 remaining from the stack S1. Such semiconductor nanosheets (channels) 112 are suspended by having an end segment (not shown) connected to a first semiconductor region forming the drain or source and another end segment (not shown) connected to a second semiconductor pad region forming the source or drain (not shown). It is noted that the first and second semiconductor pad regions forming the opposing source/drain regions are not shown in the cross-sectional view of FIG. 3B since these pad regions go into and come out of the page in which FIG. 3B is illustrated.

After channel release step resulting in the structure 340 shown in FIG. 3B, there is performed further method steps to result in the structure 350 for building the top nFET transistor. In an embodiment, structure 350 results from further method steps to deposit an interfacial layer (IL) material composed of a high-k gate dielectric material that surrounds each horizontal stacked nano-sheet Si channel layer 112. That is, as shown in the resulting structure 350, using a vapor deposition process, there is formed a layer 345 of high-k dielectric material (e.g., Hafnium oxide) surrounding and encapsulating each horizontal, spaced apart nano-sheet forming the Si channel layers 112 and formed a further high-k dielectric material layer 345 deposited on the surface of the bonding dielectric material layer 316. As referred to herein, high-k gate dielectric material is a dielectric material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric 345.

The gate dielectric material 345 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 345 can have a thickness in a range from 1 nm to 10 nm. Other thicknesses that are lesser than, or greater than, the aforementioned thickness range can also be employed for the gate dielectric material 345.

Then, as shown in FIG. 3B, the structure 350 additionally results from the further method steps of forming a further dummy gate structure 355 by depositing a sacrificial metal material to form a sacrificial metal gate structure in the manner as used to form the prior formed dummy metal gate structure 335. A further Insulator layer 346 is deposited on top of the sacrificial metal gate structure 355 for subsequent use in bonding to a further semiconductor substrate.

Figure 3C:
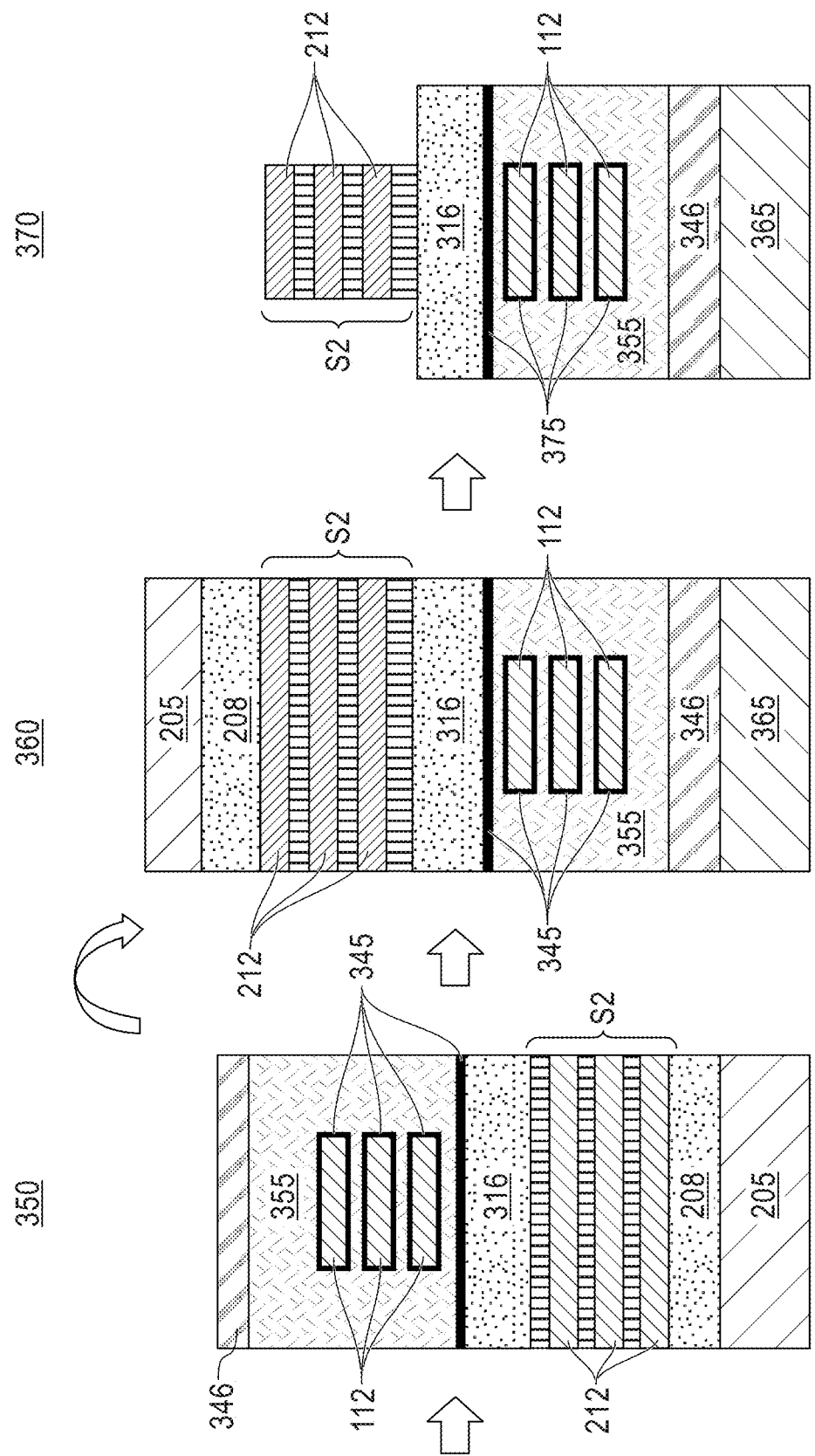

Continuing to FIG. 3C, starting with the structure 350 including the built top NS FET (e.g., nFET), a further structure 360 is formed that results from a further step of wafer flipping and bonding on a semiconductor substrate 365. That is, after wafer flip, the top insulator layer 346 is caused to bond to the substrate layer 365 of a further (e.g., third) wafer.

FIG. 3C depicts a further structure 370 resulting from performing a further step of removing the top wafer substrate and box oxide layer (SOI) according to the first embodiment. In an embodiment, a series of etching and/or chemical-mechanical planarizing (CMP) steps can be performed to remove top wafer substrate layer 205 and underlying BOX layer 208 and expose a top surface of the underlying multiple, horizontal stacked nano-sheet alternating layered stack S2.

The resulting structure 370 shown in FIG. 3C results from a further performed step of lithographic patterning and etching. The lithographic step can include forming a photoresist (not shown) atop a hard mask (not shown) deposited upon top of surface of layered stack S2, exposing the photoresist to a desired pattern of radiation and then developing the exposed photoresist utilizing a conventional resist developer. The pattern within the photoresist is then transferred through the hard mask (not shown) and into the underlying alternating layer nanosheet stack S2. A single etch or multiple etching can be used to provide the resulting structure 370 illustrated in FIG. 3C. The etch or multiple etch can include a dry etch process, a chemical wet etch process, or any combination thereof. When a dry etch is used, the dry etch can be a reactive ion etch process, a plasma etch process, ion beam etching or laser ablation. The patterned photoresist material can be removed any time after transferring the pattern into at least the hard mask utilizing a conventional stripping process. As a result of performing lithographic patterning and etching the width of the multiple, horizontal stacked nano-sheet stack S2 is defined for forming the gate all-around FET structure of the bottom NS FET transistor according to the first embodiment.

Figure 3D:
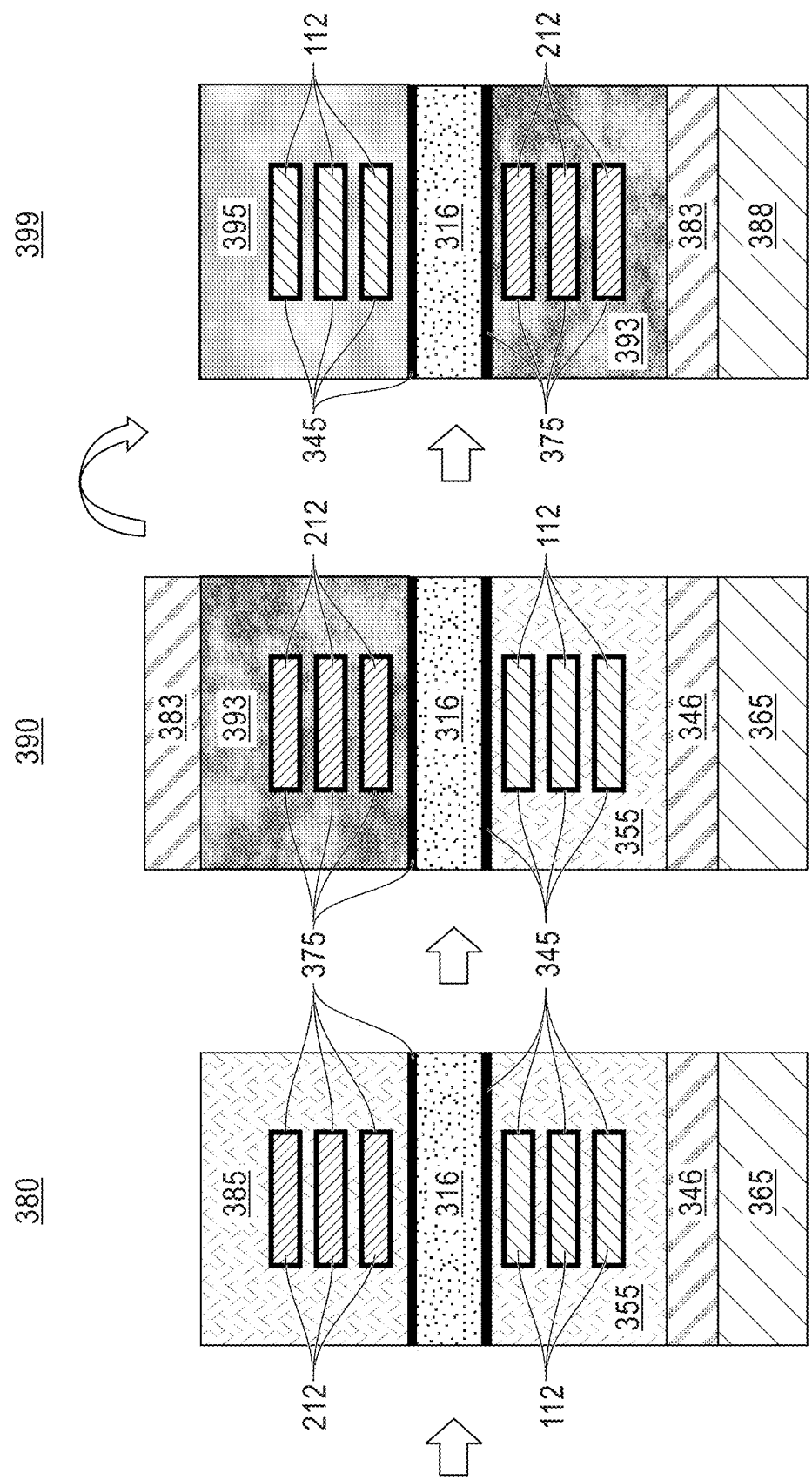

FIG. 3D shows a further resulting structure 380 after performing the further process steps for forming a NS FET as shown in FIG. 3B. For example, structure 380 results from the RMG process flow that includes steps to form the bottom pFET nanosheet device including steps for: forming a thin dummy gate dielectric layer (not shown) which layer may be formed of a gate metal dielectric material upon exposed top and sidewall surfaces of the exposed multiple, horizontal stacked nano-sheet stack S2 and exposed opposite top surface of the bonding wafer dielectric 316; forming a dummy metal gate structure surrounding the stack S2 of multiple, horizontal stacked nano-sheet channel layers and forming pFET source and drain regions (not shown); forming a top oxide layer upon the top of the dummy gate (not shown); forming a further structure resulting from process steps performed to remove dummy gate to expose the multiple, horizontal stacked nano-sheet semiconductor (e.g., Si) channel layers 212, and after dummy gate removal, performing a channel release step in the standard replacement gate integration using vapor phase HCl to remove the sacrificial semiconductor material layers 214 from the stack S2 and provide suspended, vertically spaced apart semiconductor nanosheets (channels) 212 remaining from the stack S2. After channel release step, there is performed further method steps for building the bottom pFET transistor by first depositing an interfacial layer (IL) material composed of a high-k gate dielectric material 375 to surround each horizontal stacked nano-sheet Si channel layer 212 and further form a high-k dielectric material layer 375 deposited on the opposite exposed surface of the bonded dielectric material layers 316. Then, as shown in FIG. 3D, the structure 380 additionally results from the further method steps of forming a further dummy gate structure 385 by depositing a sacrificial metal material to form an identical sacrificial metal gate structure.

A further structure 390 is shown in FIG. 3D resulting from additional process steps of replacing the bottom transistor dummy gate 385 with a valence band edge work function metal (WFM) to form the bottom NS pFET metal gate 393 spanning across and surrounding formed NS channels. Example work function metals for the NS pFET transistor can include but are not limited to: valence band edge metals selected from Pt, Rh, Ir, Ru, Cu, Os, Be, Co, Pd, Te, Cr, Ni, TiN and alloys thereof. Then, a further dielectric (e.g., oxide) material layer 383 is deposited atop the WFM gate 393 using well-known dielectric material deposition processes. The wafer having resulting structure 390 is flipped and the dielectric material layer 383 is bonded to a substrate 388 of a further wafer in order to replace the top NS nFET transistor dummy gate structure 355 with a conduction band edge work function metal.

A final structure 399 is shown in FIG. 3D resulting from additional process steps of flipping the wafer structure, etching and/or CMP steps for removing substrate 365 and dielectric material layer 346 above the bottom transistor dummy gate 355, and replacing the bottom transistor dummy gate structure 355 with a conduction band edge work function metal to form the top NS nFET metal gate 395 spanning across and surrounding formed NS channels. Example work function metals for the NS nFET transistor can include but are not limited to: conduction band edge metals selected from Hf, Ti, Zr, Cd, La, Tl, Yb, Al, Ce, Eu, Li, Pb, Tb, Bi, In, Lu, Nb, Sm, V, Ga, Mg, Gd, Y, TiAl and alloys thereof.

The resulting self-aligned hybrid substrate stacked GAA (Gate-all-around) transistor 399 formed using the wafers and stack structures S1, S2 of FIG. 2A, 2B, according to a method of a first embodiment shown in FIGS. 3A-3D, results from the first semiconductor material stack, S1, used in forming a first nanosheet transistor having semiconductor channel material nanosheets for a nFET device having a (100) dominant plane crystalline orientation with (100) sidewall, and the second semiconductor material stack, S2, used in forming a second nanosheet transistor having semiconductor channel material nanosheets for an pFET device having (110) dominant plane crystalline orientation with (100) sidewall. For the pFET NS, the substrate could be Si or SiGe or other semiconductor materials and for the nFET NS, the substrate could be Si or other high mobility channel material like GaAs.

Figure 4A:
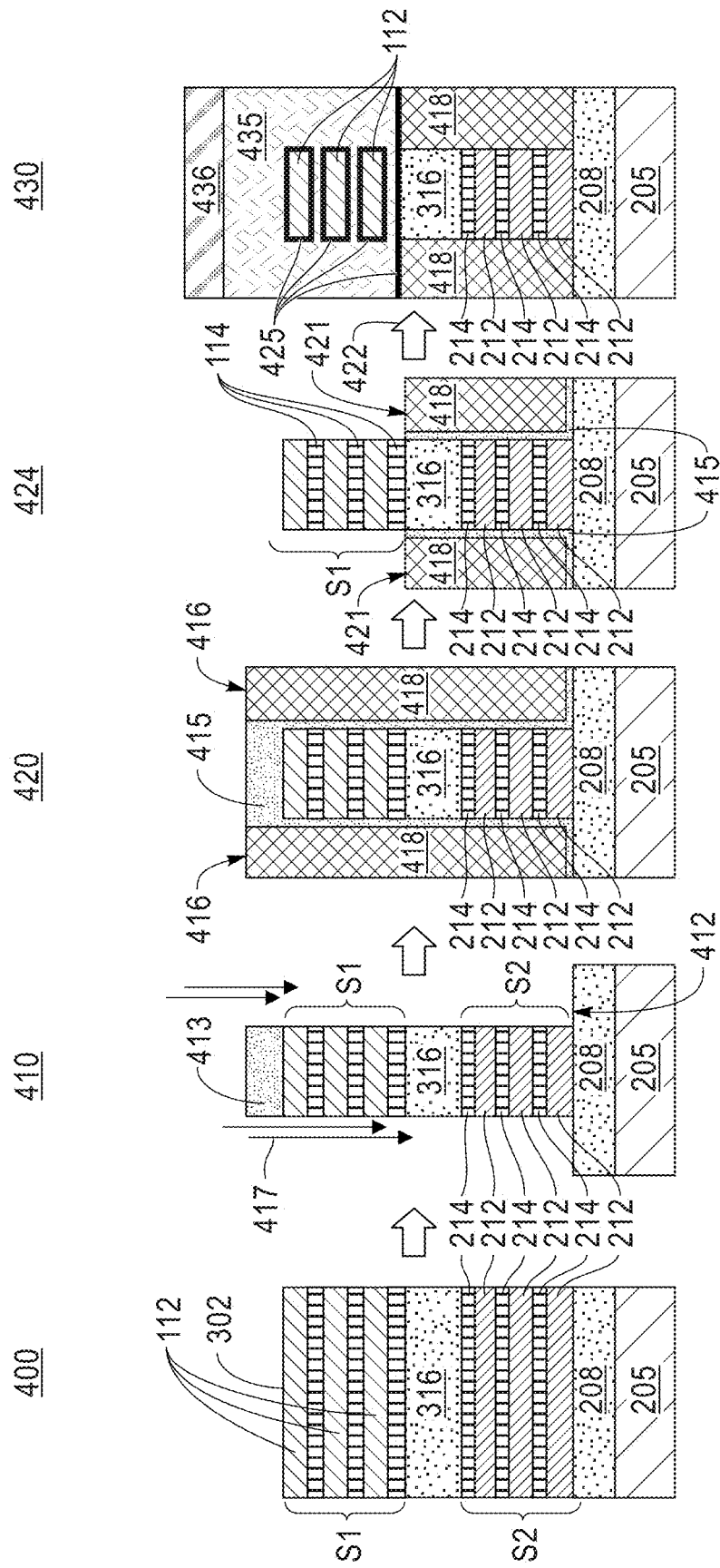
FIGS. 4A-4B depict method steps for forming a vertically stacked CMOS (pFET NS GAA/nFET NS GAA) structure according to a second embodiment.
Figure 4B:
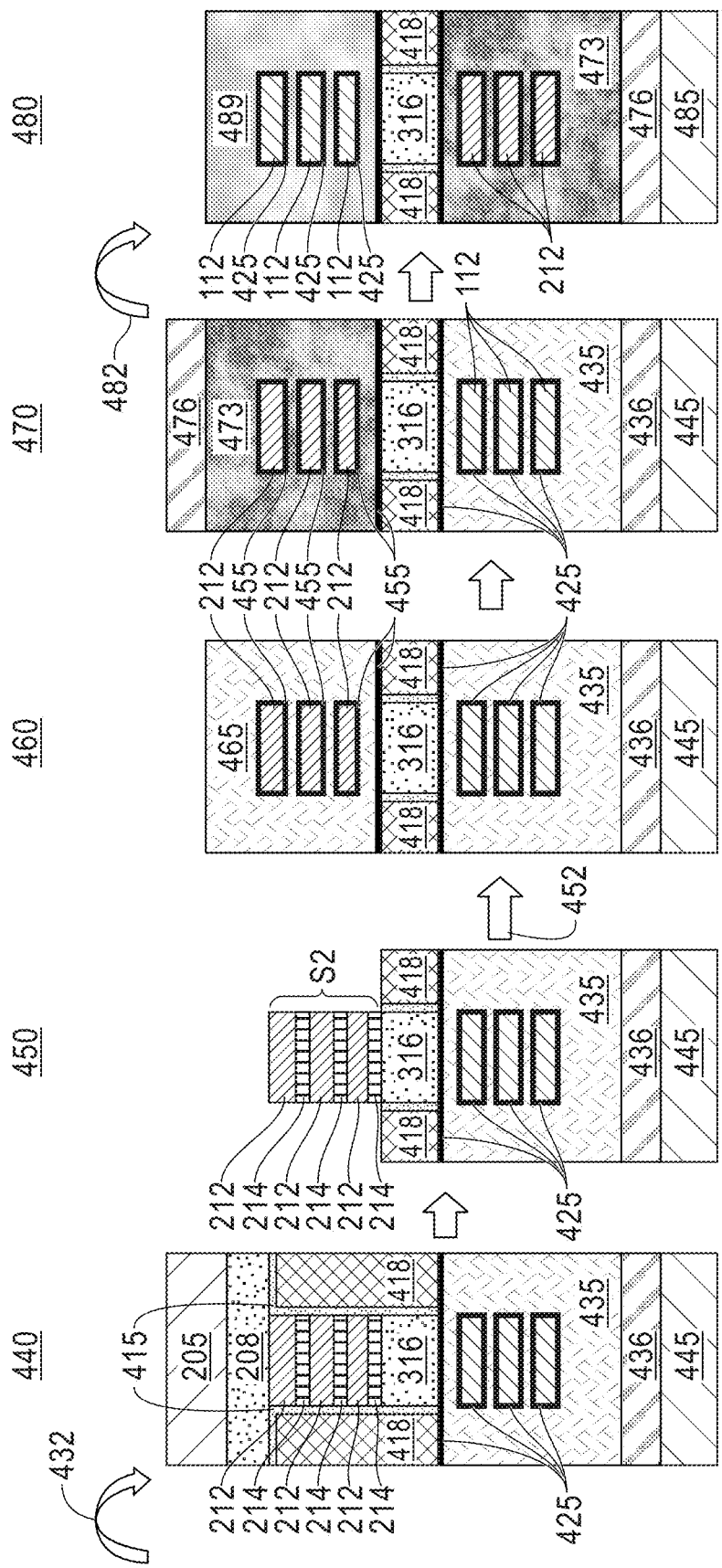

FIGS. 4A-4B depict method steps for forming a vertically stacked CMOS (pFET NS GAA/nFET NS GAA) structure according to a second embodiment. This vertically stacked CMOS (pFET NS/nFET NS) structure includes a bottom NS pFET NS and top NS nFET that are connected by insulators vertically. In the first embodiment, the insulators are discontinuous but vertically aligned by forming self-aligned NS channels of both the active devices.

FIG. 4A depicts a result of bonding a first wafer having formed stack S1 (such as wafer 100 of FIG. 2A having the (100) surface SOI substrate and alternately stacked nanosheet channel layer structures) with a second wafer having formed stack S2 (such as wafer 200 of FIG. 2B having the (100) surface SOI substrate and alternately stacked nanosheet channel layer structures) to result in a stacked structure 400. In particular, the structure 400 shown in FIG. 4A results from a flipping of the first wafer 100 (and non-self-aligned stack S1) and bonding the oxide HM layer 116 to the HM layer 216 of the second wafer 200 (having non self-aligned stack S2). This first wafer 100 is flipped and the top dielectric material layer 116 is bonded to the top dielectric material layer surface 216 of the second wafer 200 to form a bonded dielectric material layer 316. The structure 400 shown in FIG. 4A further results from performing a further step of removing the top wafer substrate and box oxide layer (SOI), using a series of etching and/or chemical-mechanical planarizing (CMP) steps to expose a top surface 302 of the underlying alternating layered stack S1.

FIG. 4A depicts a further structure 410 resulting after performing further process steps for building the top FET transistor. In particular, process steps including lithographic patterning and etching are performed that include forming a photoresist (not shown) atop a hard mask 413 deposited upon top of surface 302 (not shown), exposing the photoresist to a desired pattern of radiation and then developing the exposed photoresist utilizing a conventional resist developer. The pattern within the photoresist is then transferred through the hard mask and into the underlying alternating layer nanosheet stack. A single etch or multiple etching 417 can be used to trim the width of the whole stacked structure 400 to form self-aligned nano-sheet stacks S1, S2. In an embodiment, a RIE etch selective to the top surface 412 of the buried oxide layer 208 can be performed. Then, a step is performed to deposit a dielectric material layer 415 around the whole trimmed structure and surface 412. This dielectric material can be silicon dioxide or like oxide material deposited on the surfaces by PVD or CVD processes. The thickness of dielectric material layer 415 can range between 1 nm and 5 nm.

Then, using convention deposition processes, a further interlevel dielectric material 418 is deposited on each side of the trimmed self-aligned nano-sheet stacks S1, S2 and atop the surfaces of the dielectric material layer 415 and this resulting structure is planarized to render a top surface of the dielectric material layer 415 co-planar with a top surface of the interlevel dielectric material layer 418 as shown as the structure 420 of FIG. 4A.

Further to the top FET building process, FIG. 4A depicts a further structure 424 resulting from further lithographic patterning and etching steps to expose the self-aligned stack S1. In particular, a single timed etch or multiple timed etches can be used to remove both the outer dielectric material layers 418 and surrounding dielectric material layer 415 to expose the whole stack S1 structure and leave top surfaces 421 of the remaining interlevel dielectric material 418 portions at either side of the trimmed bonding layer 316 at the bottom of stack S1. The etch or multiple etch can include a dry etch process, a chemical wet etch process, or any combination thereof. When a dry etch is used, the dry etch can be a reactive ion etch process, a plasma etch process, ion beam etching or laser ablation. As a result of performing these lithographic patterning and etching steps, the stack S1 of the structure 420 is subject to processes for forming the gate all-around top NS FET structure according to the second embodiment.

In an embodiment, further process steps that employ the RMG process flow 422 are then performed to form an intermediate NS FET device structure 430 from the structure 424 in FIG. 4A. These process steps can include but are not limited to: forming a thin dummy gate dielectric material layer (not shown) of a gate metal dielectric material upon exposed top and sidewall surfaces of the exposed stack S1 and exposed top surfaces 421 of the interlevel dielectric material layers 418; forming a dummy metal gate structure surrounding the stack S1 of multiple, horizontal stacked nano-sheet channel layers and forming nFET source and drain regions (not shown) connecting at either side thereof; forming a top oxide layer upon the top of the dummy gate (not shown); forming a further structure resulting from process steps performed to remove dummy gate to expose the multiple, horizontal stacked nano-sheet semiconductor (e.g., Si) channel layers 112, and after dummy gate removal, performing a channel release step in the standard replacement gate integration using vapor phase HCl to remove the sacrificial semiconductor material layers 114 from the stack S1 and provide suspended, vertically spaced apart semiconductor nanosheets (channels) 112 remaining from the stack S1. After channel release step, there is performed further method steps for building the top nFET transistor by first depositing an interfacial layer (IL) material composed of a high-k gate dielectric material to surround each horizontal, vertically spaced apart stacked nano-sheet Si channel layer 112 and form a layer 425 of high-k dielectric material (e.g., Hafnium oxide) surrounding and encapsulating each horizontal nano-sheet forming a Si channel layer 112 and further form a high-k gate dielectric material layer 425 deposited on the surfaces 421 of the dielectric material layers 418 and top surface of bonded dielectric layers 316. Then, as shown in FIG. 4A, a structure 430 additionally results from the further method steps of forming a further dummy metal gate structure 435 by depositing a sacrificial metal material to form an identical sacrificial metal gate structure. A further insulator layer 436 is deposited on top of the sacrificial metal gate structure 435 for subsequent use in bonding to a further semiconductor substrate.

Continuing in FIG. 4B, from the structure 430 including the built top NS FET (e.g., nFET), a further structure 440 is formed that results from a further step of wafer flipping 432 and bonding the flipped wafer onto a semiconductor substrate 445. That is, after wafer flip, the top insulator layer 436 is caused to bond, e.g., using the Smart Tec™ process, to the substrate layer 445 of a further (e.g., third) wafer.

Then, in FIG. 4B, starting with the structure 440, there is depicted a further structure 450 resulting from further process steps for removing the top wafer substrate and box oxide layer (SOI) according to the second embodiment. In this embodiment, a series of etching and/or chemical-mechanical planarizing (CMP) steps can be performed to remove top wafer substrate layer 205 and underlying BOX layer 208 and expose a top surface of the underlying alternating layered stack S2.

The resulting structure 450 shown in FIG. 4B further results from a further performed step of lithographic patterning and etching to expose the self-aligned stack S2. In an embodiment, a single timed etch or multiple timed etches can be used to remove both the outer dielectric material layers 418 and surrounding dielectric material layer 415 to expose the whole stack S2 structure and leave top surfaces of the remaining interlevel dielectric material portions 418 at either side of the trimmed bonding layer 316 at the bottom of stack S2. The etch or multiple etch can include a dry etch process, a chemical wet etch process, or any combination thereof. When a dry etch is used, the dry etch can be a reactive ion etch process, a plasma etch process, ion beam etching or laser ablation. As a result of performing these lithographic patterning and etching steps, the stack S2 of the structure 450 is available to form the gate all-around top NS FET according to the second embodiment.

FIG. 4B shows a further resulting structure 460 after performing the further process steps for forming a top NS FET. For example, structure 460 results from the RMG process flow 452 that includes steps to form the bottom pFET nanosheet device including steps for: forming a thin dummy gate dielectric layer (not shown) which layer may be formed of a gate metal dielectric material upon exposed top and sidewall surfaces of the exposed stack S2 and exposed top surfaces of the interlevel dielectric layers 418; forming a dummy metal gate structure surrounding the stack S2 of multiple, horizontal stacked nano-sheet channel layers and forming pFET source and drain regions (not shown) connecting at either side thereof; forming a top oxide layer upon the top of the dummy gate (not shown); forming a further structure resulting from process steps performed to remove dummy gate to expose the multiple, horizontal stacked nano-sheet semiconductor (e.g., Si) channel layers 212, and after dummy gate removal, performing a channel release step in the standard replacement gate integration using vapor phase HCl to remove the sacrificial semiconductor material layers 214 from the stack S2 and provide suspended, vertically spaced apart semiconductor nanosheets (channels) 212 remaining from the stack S2. After channel release step, there is performed further method steps for building the bottom pFET transistor by first depositing an interfacial layer (IL) material composed of a high-k gate dielectric material to surround each horizontal, spaced apart stacked nano-sheet Si channel layer 212 with a layer 455 of high-k dielectric material (e.g., Hafnium oxide) surrounding and encapsulating each horizontal nano-sheet forming a Si channel layer 212 and further form a high-k dielectric material layer 455 deposited on the exposed top surfaces of the interlevel dielectric layers 418 and top surface of bonded dielectric layers 316. Then, as shown in FIG. 4B, the structure 460 additionally results from the further method steps of forming a further dummy gate structure 465 by depositing a sacrificial metal material to form an identical sacrificial metal gate structure as the prior formed dummy metal gate structure.

A further structure 470 is shown in FIG. 4B resulting from additional process steps of replacing the bottom transistor dummy gate 465 with a valence band edge work function metal to form the bottom NS pFET metal gate 473 spanning across and surrounding formed NS channels. Example work function metals for the NS pFET transistor can include but are not limited to: valence band edge metals selected from Pt, Rh, Jr, Ru, Cu, Os, Be, Co, Pd, Te, Cr, Ni, TiN and alloys thereof. Then, a further dielectric material layer 476 is deposited atop the WFM gate 473 using well-known dielectric material deposition processes. The wafer having resulting structure 470 is then flipped at 482 and dielectric material layer 476 bonded to a substrate 485 of a further wafer in order to replace the bottom transistor dummy gate structure 435 with a conduction band edge work function metal.

After the wafer flipping the wafer structure, a final structure 480 is shown in FIG. 4B resulting from additional process steps of etching and/or CMP steps for removing substrate 445 and dielectric material layer 436 above the bottom transistor dummy gate 435 and replacing the bottom transistor dummy gate structure 435 with a conduction band edge work function metal to form the top NS nFET metal gate 489 spanning across and surrounding formed NS channels. Example work function metals for the NS nFET transistor can include but are not limited to: conduction band edge metals selected from Hf, Ti, Zr, Cd, La, Tl, Yb, Al, Ce, Eu, Li, Pb, Tb, Bi, In, Lu, Nb, Sm, V, Ga, Mg, Gd, Y, TiAl and alloys thereof.

The resulting self-aligned hybrid substrate stacked GAA (Gate-all-around) transistor 480 formed using the wafers and stack structures S1, S2 of FIG. 2A, 2B, according to a method of a second embodiment shown in FIGS. 4A-4B, results from the first semiconductor material stack, S1, used in forming a first nanosheet transistor having semiconductor channel material nanosheets for a nFET device having a (100) dominant plane with (110) sidewall, and the second semiconductor material stack, S2, used in forming a second nanosheet transistor having semiconductor channel material nanosheets for an pFET device having (110) dominant plane with (100) sidewall. For the pFET NS, the substrate could be Si or SiGe or other semiconductor materials and for the nFET NS, the substrate could be Si or other high mobility channel material like GaAs.

Figure 5A:
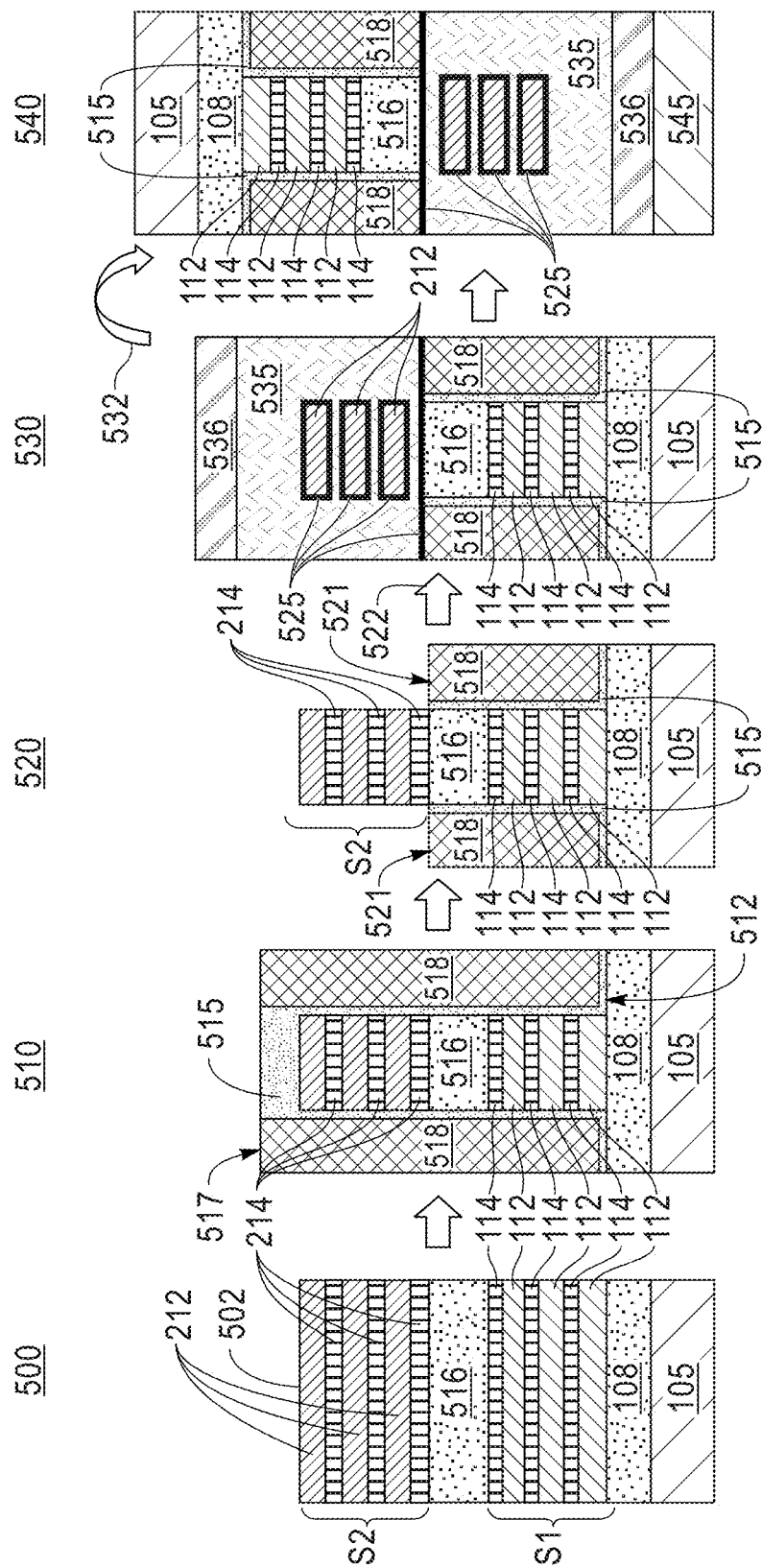
FIGS. 5A-5B depict method steps for forming a vertically stacked CMOS (pFET NS GAA/nFET NS GAA) structure according to a third embodiment.
Figure 5B:
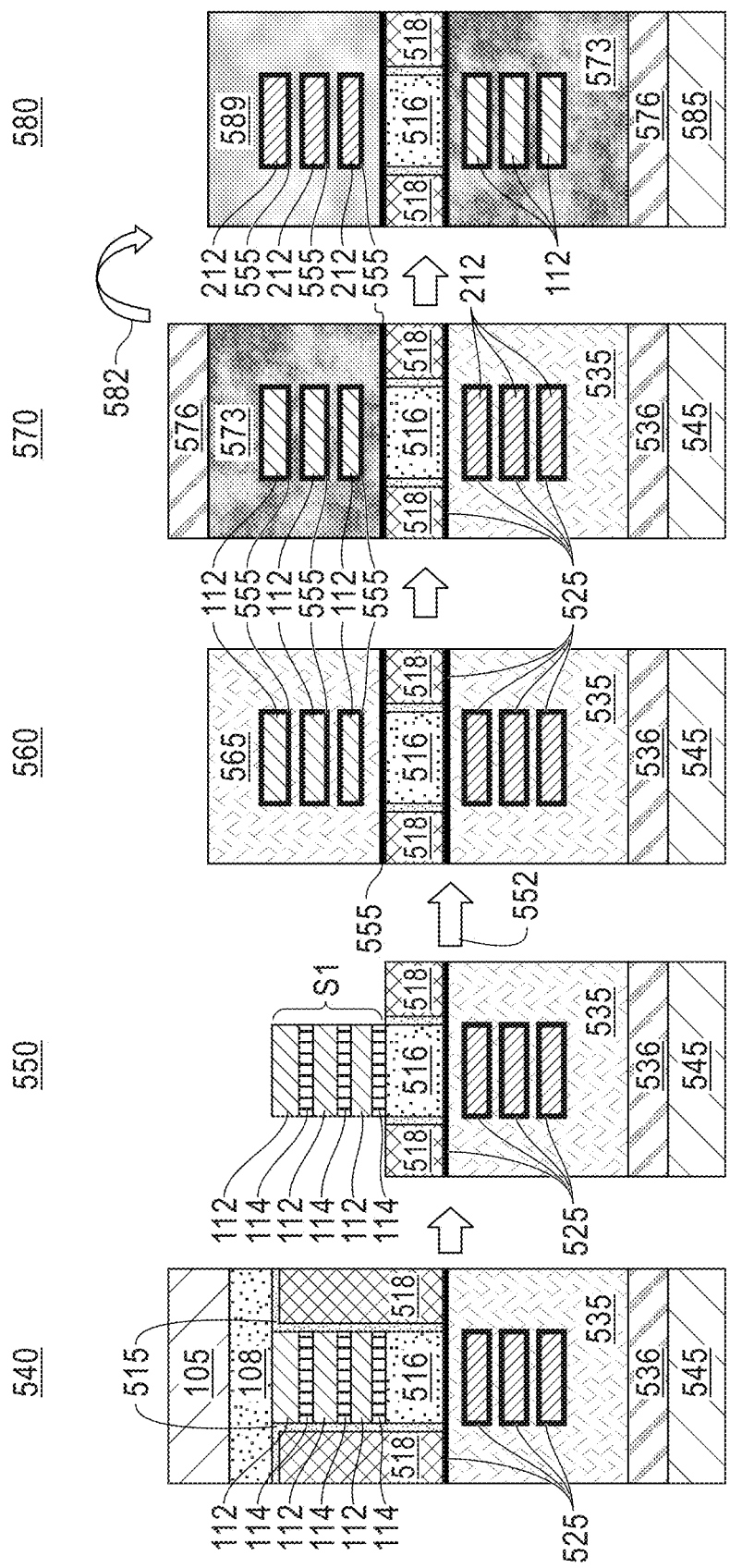

FIGS. 5A-5B depict method steps for forming a vertically stacked CMOS (pFET NS GAA/nFET NS GAA) structure according to a third embodiment. Compared to the vertically stacked CMOS (pFET NS/nFET NS) structure according to the second embodiment depicted in FIGS. 4A-4B, the third embodiment includes an opposite stacked structure having a top NS pFET and bottom NS nFET that are connected by insulators vertically. In the third embodiment, the insulators are discontinuous but vertically aligned with application of self-aligning the active devices.

FIG. 5A depicts a structure 500 resulting from a bonding of a first wafer having formed stack S1 (such as wafer 200 of FIG. 2B having the <100> SOI crystalline orientation substrate and alternately stacked nanosheet channel layer structures) with a second wafer having formed stack S1 (such as wafer 100 of FIG. 2A having the <110> SOI crystalline orientation substrate and alternately stacked nanosheet channel layer structures) to result in a non-self-aligned stacked structure. In particular, the structure 500 shown in FIG. 5A results from a flipping of the first wafer 200 (and non-self-aligned stack S2 of FIG. 2B) and bonding the oxide HM layer 216 to the HM layer 116 of the first wafer 100 (having non self-aligned stack S1 of FIG. 2A). This first wafer 200 is flipped and the top dielectric material layer 216 is bonded to the top dielectric material layer surface 116 of the first wafer 100 to form a bonded dielectric material layer 516. The structure 500 shown in FIG. 5A further results from performing a further step of removing the top wafer substrate 205 and box oxide layer (SOI) 208, using a series of etching and/or chemical-mechanical planarizing (CMP) steps to expose a top surface 502 of the underlying alternating layered stack S2.

FIG. 5A depicts a further structure 510 resulting after performing further process steps for building the top FET transistor. In particular, process steps including lithographic patterning and etching are performed that include forming a photoresist (not shown) atop a hard mask (not shown) deposited upon top of surface 502, exposing the photoresist to a desired pattern of radiation and then developing the exposed photoresist utilizing a conventional resist developer. The pattern within the photoresist is then transferred through the hard mask and into the underlying alternating layer nanosheet stack. A single etch or multiple etching can be used to trim the width of the whole stacked structure 500 to form vertical, self-aligned nano-sheet stacks S2, S1. In an embodiment, a RIE etch selective to the top surface 512 of the buried oxide layer 108 can be performed. Then, a step is performed to deposit a dielectric material layer 515 around the whole trimmed structure and surface 512. This dielectric material can be silicon dioxide or like oxide material deposited on the surfaces by PVD or CVD processes. The thickness of dielectric material layer 515 can range between 1 nm and 5 nm.

Then, using convention deposition processes, a further interlevel dielectric material 518 is deposited on each side of the trimmed stacked structure and atop the surfaces of the dielectric material layer 515 and this resulting structure is planarized to render a top surface of the dielectric material layer 515 co-planar with a top surface 517 of the interlevel dielectric material layer 518 as shown as the structure 510 of FIG. 5A.

Further to the top FET building process, FIG. 5A depicts a further structure 520 resulting from further lithographic patterning and etching steps to expose the self-aligned stack S2. In particular, a single timed etch or multiple timed etches can be used to remove both the outer dielectric material layers 518 and surrounding dielectric material layer 515 to expose the whole stack S2 structure 450 and leave top surfaces 521 of the remaining interlevel dielectric material 518 portions at either side of the trimmed bonding layer 316 at the bottom of stack S2. The etch or multiple etch can include a dry etch process, a chemical wet etch process, or any combination thereof. When a dry etch is used, the dry etch can be a reactive ion etch process, a plasma etch process, ion beam etching or laser ablation. As a result of performing these lithographic patterning and etching steps, the stack S2 of the structure 520 is available to form the gate all-around top NS FET according to the third embodiment.

Further process steps that employ the RMG process flow 522 are then performed to form an intermediate NS FET device structure 530 from the structure 520 in FIG. 5A. These process steps can include but are not limited to: forming a thin dummy gate dielectric material layer (not shown) of a gate metal dielectric material upon exposed top and sidewall surfaces of the exposed stack S2 and exposed top surfaces 521 of the interlevel dielectric material layers 518; forming a dummy metal gate structure surrounding the stack S2 of multiple, horizontal stacked nano-sheet channel layers and forming pFET source and drain regions (not shown) connecting at either side of the channels; forming a top oxide layer upon the top of the dummy gate (not shown); forming a further structure resulting from process steps performed to remove dummy gate to expose the multiple, horizontal stacked nano-sheet semiconductor (e.g., Si) channel layers 212, and after dummy gate removal, performing a channel release step in the standard replacement gate integration using vapor phase HCl to remove the sacrificial semiconductor material layers 214 from the stack S2 and provide suspended, vertically spaced apart semiconductor nanosheets (channels) 212 remaining from the stack S2. After channel release step, there is performed further method steps for building the top pFET transistor by first depositing an interfacial layer (IL) material composed of a high-k gate dielectric material to surround each horizontal, spaced apart stacked nano-sheet Si channel 212, form a layer 525 of high-k dielectric material (e.g., Hafnium oxide) surrounding and encapsulating each horizontal nano-sheet forming a Si channel layer 212 and further form a high-k gate dielectric material layer 525 deposited on the surfaces 521 of the dielectric material layers 518 and top surface of the bonded dielectric layer 516. Then, as shown in FIG. 5A, the structure 530 additionally results from the further method steps of forming a further dummy metal gate structure 535 by depositing a sacrificial metal material to form an identical sacrificial metal gate structure as the prior formed dummy metal gate structure. A further Insulator layer 536 is deposited on top of the sacrificial metal gate structure 535 for subsequent use in bonding to a further semiconductor substrate.

Continuing in FIG. 5A, starting with the structure 530 including the built top NS FET (e.g., pFET), a further structure 540 is formed that results from a further step of wafer flipping and bonding the flipped wafer onto a semiconductor substrate 545. That is, after wafer flip 532, the top insulator layer 536 is bonded, to the substrate layer 545 of a further (e.g., third) wafer.

Referring to FIG. 5B, starting with the structure 540, there is depicted a further structure 550 resulting from further process steps for removing the top wafer substrate and box oxide layer (SOI) according to the second embodiment. In this embodiment, a series of etching and/or chemical-mechanical planarizing (CMP) steps can be performed to remove top wafer substrate layer 105 and underlying BOX layer 108 and expose a top surface of the underlying alternating layered NS stack S1.

The resulting structure 550 shown in FIG. 5B further results from a further performed step of lithographic patterning and etching to expose the self-aligned stack S1. In particular, a single timed etch or multiple timed etches can be used to remove both the outer dielectric material layers 518 and surrounding dielectric material layer 515 to expose the whole stack S1 structure and leave top surfaces of the remaining interlevel dielectric material 518 portions at either side of the trimmed bonding layer 516 at the bottom of stack S1. The etch or multiple etch can include a dry etch process, a chemical wet etch process, or any combination thereof. When a dry etch is used, the dry etch can be a reactive ion etch process, a plasma etch process, ion beam etching or laser ablation. As a result of performing these lithographic patterning and etching steps, the stack S1 of the structure 550 is available to form the gate all-around top NS FET according to the third embodiment.

FIG. 5B shows a further resulting structure 560 after performing the further process steps for forming a top NS FET. For example, structure 560 results from the RMG process flow 552 that includes steps to form the bottom nFET nanosheet device including steps for: forming a thin dummy gate dielectric layer (not shown) which layer may be formed of a gate metal dielectric material upon exposed top and sidewall surfaces of the exposed stack S1 and exposed top surfaces of the interlevel dielectric layers 518; forming a dummy metal gate structure surrounding the stack S1 of multiple, horizontal stacked nano-sheet channel layers and forming nFET source and drain regions (not shown) connecting the channels at opposite ends; forming a top oxide layer upon the top of the dummy gate (not shown); forming a further structure resulting from process steps performed to remove dummy gate to expose the multiple, horizontal stacked nano-sheet semiconductor (e.g., Si) channel layers 112, and after dummy gate removal, performing a channel release step in the standard replacement gate integration using vapor phase HCl to remove the sacrificial semiconductor material layers 114 from the stack S1 and provide suspended, vertically spaced apart semiconductor nanosheets (channels) 112 remaining from the stack S1. After channel release step, there is performed further method steps for building the bottom nFET transistor by first depositing an interfacial layer (IL) material composed of a high-k gate dielectric material to surround each horizontal, spaced apart stacked nano-sheet Si channel layer 112 and form a layer 555 of high-k dielectric material (e.g., Hafnium oxide) surrounding and encapsulating each horizontal nano-sheet forming a Si channel layer 112 and further deposit a high-k dielectric material layer 555 formed on the exposed top surfaces of the interlevel dielectric layers 518 and top surface of bonded dielectric layers 516. Then, as shown in FIG. 5B, the structure 560 additionally results from the further method steps of forming a further dummy gate structure 565 by depositing a sacrificial metal material to form an identical sacrificial metal gate structure as the prior formed dummy metal gate structure.

A further structure 570 is shown in FIG. 5B resulting from additional process steps of replacing the bottom transistor dummy gate 565 with a conductive band edge work function metal to form the bottom NS nFET metal gate 573 spanning across and surrounding formed NS channels. Example work function metals for the NS nFET transistor can include but are not limited to: conduction band edge metals selected from Hf, Ti, Zr, Cd, La, Tl, Yb, Al, Ce, Eu, Li, Pb, Tb, Bi, In, Lu, Nb, Sm, V, Ga, Mg, Gd, Y, TiAl and alloys thereof. Then, a further dielectric material layer 576 is deposited atop the WFM gate 573 using well-known dielectric material deposition processes. The wafer having resulting structure 570 is then flipped at 582 and dielectric material layer 576 is bonded to a substrate 585 of a further wafer in order to replace the top transistor dummy gate structure 535 with a valence band edge work function metal.

A final structure 580 is shown in FIG. 5B resulting from additional process steps of flipping the wafer structure, etching and/or CMP steps for removing substrate 545 and dielectric material layer 536 above the top transistor dummy gate 535, and replacing the top transistor dummy gate structure 535 with a valence band edge work function metal to form the top NS pFET metal gate 589 spanning across and surrounding formed NS channels. Example work function metals for the NS pFET transistor can include but are not limited to: valence band edge metals selected from Pt, Rh, Jr, Ru, Cu, Os, Be, Co, Pd, Te, Cr, Ni, TiN and alloys thereof.

The resulting self-aligned hybrid substrate stacked GAA (Gate-all-around) transistor 580 formed using the wafers and stack structures S1, S2 of FIG. 2A, 2B, according to a method of a third embodiment shown in FIGS. 5A-5B, results from the first semiconductor material stack, S1, used in forming a first nanosheet transistor having semiconductor channel material nanosheets for a bottom NS nFET device having a (100) dominant plane crystalline orientation with (110) sidewall, and the second semiconductor material stack, S2, used in forming a second nanosheet transistor having semiconductor channel material nanosheets for a top NS pFET device having (110) dominant plane crystalline orientation with (100) sidewall. For the top pFET NS, the substrate could be Si or SiGe or other semiconductor materials and for the bottom nFET NS, the substrate could be Si or other high mobility channel material like GaAs.

Figure 6A:
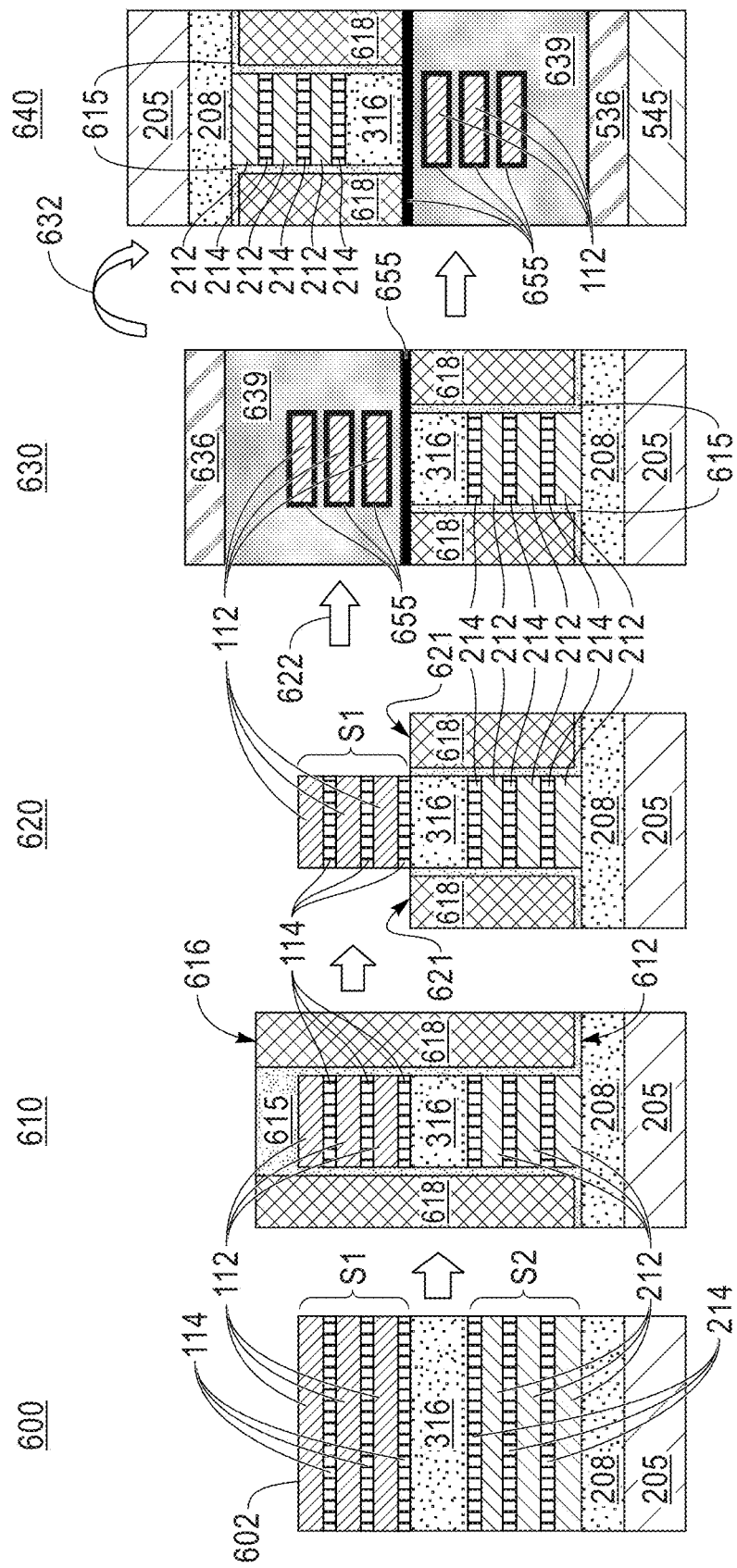
FIGS. 6A-6B depict method steps for forming a vertically stacked CMOS (nFET NS GAA/pFET NS GAA) structure according to a fourth embodiment
Figure 6B:
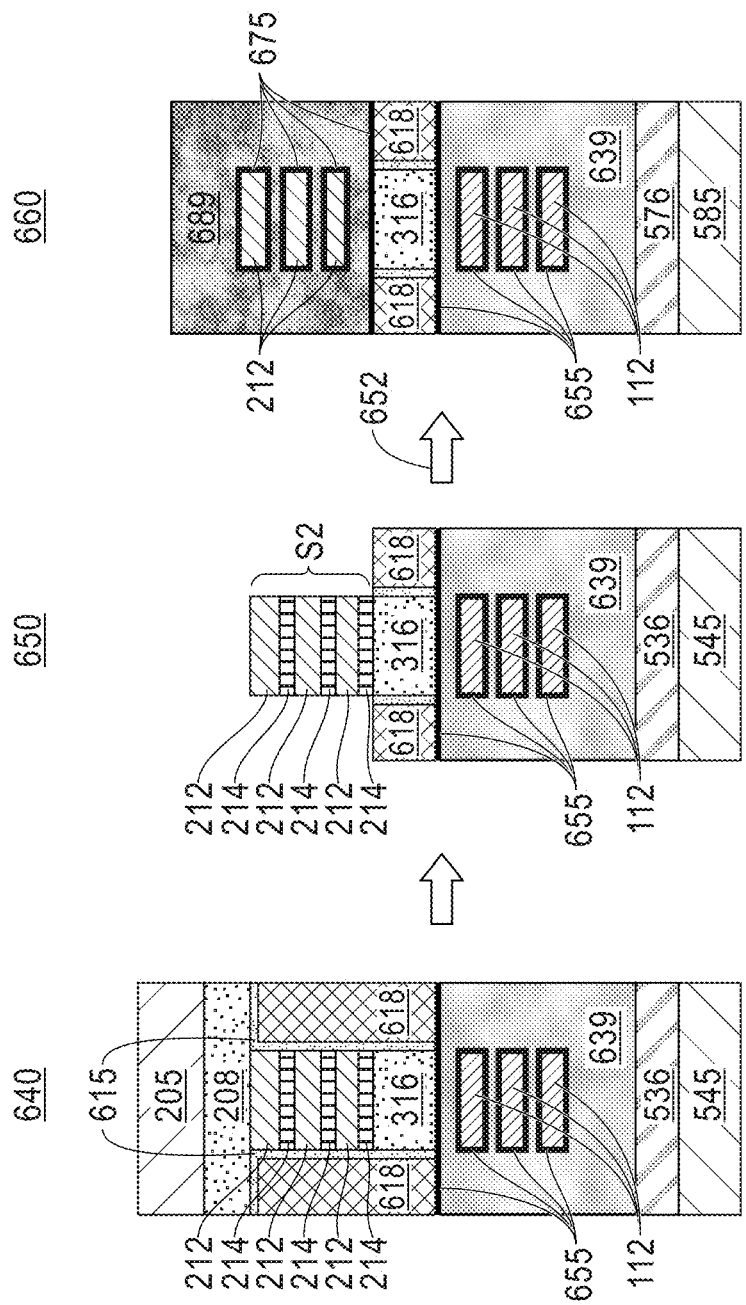

FIGS. 6A-6B depict method steps for forming a vertically stacked CMOS (nFET NS GAA/pFET NS GAA) structure according to a fourth embodiment. Compared to the vertically stacked CMOS (nFET NS/pFET NS) structure according to the second embodiment, the structure of the fourth embodiment includes a vertically stacked top NS pFET NS and bottom NS nFET that are connected by insulators vertically. In the fourth embodiment, the insulators are discontinuous but vertically aligned with application of self-aligning the active devices.

FIG. 6A depicts a result of bonding a first wafer having formed stack S1 (such as wafer 100 of FIG. 2A having the (100) surface SOI substrate and alternately stacked nanosheet channel layer structures) with a second wafer having formed stack S2 (such as wafer 200 of FIG. 2B having the (110) surface SOI substrate and alternately stacked nanosheet channel layer structures) to result in a non-self-aligned stacked structure. In particular, the structure 600 shown in FIG. 6A results from a flipping of the first wafer 100 (and non-self-aligned stack S1) and bonding the oxide HM layer 116 to the HM layer 216 of the second wafer 200 (having non self-aligned stack S2). This first wafer 100 is flipped and the top dielectric material layer 116 is bonded to the top dielectric material layer surface 216 of the second wafer 200 to form a bonded dielectric material layer 316. The structure 600 shown in FIG. 6A further results from performing a further step of removing the top wafer substrate 105 and box oxide layer (SOI) 108, using a series of etching and/or chemical-mechanical planarizing (CMP) steps to expose a top surface 602 of the underlying alternating layered NS stack S1.

FIG. 6A depicts a further structure 610 resulting after performing further process steps for building the bottom NS FET transistor. In particular, process steps including lithographic patterning and etching are performed that include forming a photoresist (not shown) atop a hard mask (not shown) deposited upon top of surface 602, exposing the photoresist to a desired pattern of radiation and then developing the exposed photoresist utilizing a conventional resist developer. The pattern within the photoresist is then transferred through the hard mask and into the underlying alternating layer nanosheet stack. A single etch or multiple etching can be used to trim the width of the whole stacked structure 600 to form vertical, self-aligned nano-sheet stacks S1, S2. In an embodiment, a RIE etch selective to the top surface 612 of the buried oxide layer 208 can be performed. Then, a step is performed to deposit a dielectric material layer 615 around the whole trimmed structure and surface 612. This dielectric material can be silicon dioxide or like oxide material deposited on the surfaces by PVD or CVD processes. The thickness of dielectric material layer 615 can range between 1 nm and 5 nm.

Then, using convention deposition processes, a further interlevel dielectric material 618 is deposited on each side of the trimmed vertically self-aligned stacked structure and atop the surfaces of the dielectric material layer 615 and this resulting structure is planarized to render a top surface of the dielectric material layer 615 co-planar with a top surface of the interlevel dielectric material layer 618 as shown as the structure 610 of FIG. 6A.

Further to the bottom FET building process, FIG. 6A depicts a further structure 620 resulting from further lithographic patterning and etching steps to expose the self-aligned stack S1. In particular, a single timed etch or multiple timed etches can be used to remove both the outer dielectric material layers 618 and surrounding dielectric material layer 515 to expose the whole stack S1 structure and leave remaining top surfaces 621 of the interlevel dielectric material 618 at either side of the trimmed bonding layer 316. The etch or multiple etch can include a dry etch process, a chemical wet etch process, or any combination thereof. When a dry etch is used, the dry etch can be a reactive ion etch process, a plasma etch process, ion beam etching or laser ablation. As a result of performing these lithographic patterning and etching steps, the stack S1 of the structure 620 is available to form the gate all-around bottom NS FET according to the fourth embodiment.

Further process steps that employ the RMG process flow 622 are then performed to form an intermediate NS FET device structure 630 from the structure 620 in FIG. 6A. These process steps can include but are not limited to: forming a thin dummy gate dielectric material layer (not shown) of a gate metal dielectric material upon exposed top and sidewall surfaces of the exposed stack S1 and exposed top surfaces 621 of the interlevel dielectric material layers 618; forming a dummy metal gate structure surrounding the stack S1 of multiple, horizontal stacked nano-sheet channel layers and forming nFET source and drain regions (not shown) connecting to channels at opposite ends; forming a top oxide layer upon the top of the dummy gate (not shown); forming a further structure resulting from process steps performed to remove dummy gate to expose the multiple, horizontal stacked nano-sheet semiconductor (e.g., Si) channel layers 112, and after dummy gate removal, performing a channel release step in the standard replacement gate integration using vapor phase HCl to remove the sacrificial semiconductor material layers 114 from the stack S1 and leave suspended, vertically spaced apart semiconductor nanosheets (channels) 112 remaining from the stack S1. After channel release step, there is performed further method steps for building the bottom nFET transistor by first depositing an interfacial layer (IL) material composed of a high-k gate dielectric material to surround each horizontal stacked nano-sheet Si channel layer 112, form a layer 655 of high-k dielectric material (e.g., Hafnium oxide) surrounding and encapsulating each horizontal, spaced apart nano-sheet forming a Si channel layer 112 and further form a high-k gate dielectric material layer 655 deposited on the surfaces 621 of the dielectric material layers 618 and on top of an exposed top surface of bonded dielectric layers 316. Then, as shown in FIG. 6A, the structure 630 additionally results from the further method steps of forming a metal gate structure 639 spanning across and surrounding formed NS channels by depositing a workfunction metal to form the metal gate structure of the bottom NS FET transistor. Example work function metals for the NS nFET transistor can include but are not limited to: conduction band edge metals selected from Hf, Ti, Zr, Cd, La, Tl, Yb, Al, Ce, Eu, Li, Pb, Tb, Bi, In, Lu, Nb, Sm, V, Ga, Mg, Gd, Y, TiAl and alloys thereof. A further insulator layer 636 is deposited on top of the metal gate structure 639 for subsequent use in bonding to a further semiconductor substrate.

Continuing in FIG. 6A, from the structure 630 including the built bottom NS FET (e.g., nFET), a further structure 640 is formed that results from a further step of wafer flipping 632 and bonding the flipped wafer onto a further semiconductor substrate 545 of another wafer. That is, after wafer flip, the top insulator layer 536 is caused to bond, to the substrate layer 545 of the further (e.g., third) wafer.

Referring to FIG. 6B, starting with the structure 640, there is depicted a further structure 650 resulting from further process steps for removing the top wafer substrate and box oxide layer (SOI) according to the second embodiment. In this embodiment, a series of etching and/or chemical-mechanical planarizing (CMP) steps can be performed to remove top wafer substrate layer 205 and underlying BOX layer 208 and expose a top surface of the underlying alternating layered stack S2.

The resulting structure 650 shown in FIG. 6B further results from further performed steps of lithographic patterning and etching, e.g., using a single timed etch or multiple timed etches, to remove both the outer dielectric material layers 618 and surrounding dielectric material layer 615 to expose the whole stack S2 structure and leave a remaining top surface of the interlevel dielectric material at either side of the trimmed bonding layer 316. The etch or multiple etch can include a dry etch process, a chemical wet etch process, or any combination thereof. When a dry etch is used, the dry etch can be a reactive ion etch process, a plasma etch process, ion beam etching or laser ablation. As a result of performing these lithographic patterning and etching steps, the stack S2 of the structure 650 is available to form the gate all-around top NS FET according to the fourth embodiment.

Further process steps that employ the RMG process flow 652 are then performed to form an NS FET device structure 660 from the structure 650 in FIG. 6A. These process steps can include but are not limited to: forming a thin dummy gate dielectric material layer (not shown) of a gate metal dielectric material upon exposed top and sidewall surfaces of the exposed stack S2 and exposed top surfaces of the interlevel dielectric material layers 618; forming a dummy metal gate structure surrounding the stack S2 of multiple, horizontal stacked nano-sheet channel layers and forming pFET source and drain regions (not shown) connecting the channels at opposite ends; forming a top oxide layer upon the top of the dummy gate (not shown); forming a further structure resulting from process steps performed to remove dummy gate to expose the multiple, horizontal stacked nano-sheet semiconductor (e.g., Si) channel layers 212, and after dummy gate removal, performing a channel release step in the standard replacement gate integration using vapor phase HCl to remove the sacrificial semiconductor material layers 214 from the stack S2 and leave suspended, vertically spaced apart semiconductor nanosheets (channels) 212 remaining from the stack S2. After channel release step, there is performed further method steps for building the top nFET transistor by first depositing an interfacial layer (IL) material composed of a high-k gate dielectric material to surround each horizontal stacked nano-sheet Si channel layer 212, form a layer 675 of high-k dielectric material (e.g., Hafnium oxide) surrounding and encapsulating each horizontal, spaced apart nano-sheet forming a Si channel layer 212 and further form a high-k gate dielectric material layer 675 deposited on the top surfaces of the dielectric material layers 618 and on top of an exposed top surface of bonded dielectric layers 316.

The further structure 660 is shown in FIG. 6B results from additional process steps of forming the top transistor workfunction metal gate 689 with a valence band edge work function metal to form the top NS pFET metal gate 689 spanning across and surrounding formed NS channels. Example work function metals for the top NS pFET transistor can include but are not limited to: valence band edge metals selected from Pt, Rh, Ir, Ru, Cu, Os, Be, Co, Pd, Te, Cr, Ni, TiN and alloys thereof.

The present disclosure is directed to a three dimensional (3D) integration by vertically stacking nFETs and pFETs for area scaling. Such vertically stacking of nFETs and pFETs combined with nanosheet technology can benefit from device electrostatics control in addition to area scaling.

Each of the first to fourth embodiments depict vertically-stacked NS FET structures including a first nanosheet transistor located above a second nanosheet transistor; the first nanosheet transistor including a first channel material, wherein the first channel material includes a first crystalline orientation; the second nanosheet transistor including a second channel material, wherein the second channel material comprises a second crystalline orientation; and the first crystalline orientation is different from the second crystalline orientation.

In the case of vertically-stacked NS FET structure 399, the respective formed nanosheet channels are not self-aligned (FIG. 3D), whereas the respective formed nanosheet channels of stacked NS FET structures 480 (FIG. 4B), structure 580 (FIG. 5B), and structure 660 (FIG. 6B) each have respective nanosheet channels that are self-aligned. The structure and method herein provides a high mobility hybrid scheme for gate all around (GAA) for both nFET and pFET. This reduces the process integration complexity as well as provide an extreme ultraviolet (EUV) lithography option for both nFET and pFET.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A vertically stacked gate-all-around (GAA) semiconductor device comprising:
   a first FET GAA device having a first vertical stack of spaced apart nanosheet channels surrounded by a first gate structure, the first vertical stack of spaced apart nanosheet channels comprising a first channel material of a first crystalline orientation;
   a second FET GAA device having a second vertical stack of spaced apart nanosheet channels surrounded by a second gate structure, said second FET GAA device stacked vertically on top said first FET GAA device, the second vertical stack of spaced apart nanosheet channels comprising a second channel material of a second crystalline orientation and the first crystalline orientation is different from the second crystalline orientation; and
   an insulator material bonding layer disposed between said first gate structure and said second gate structure.

2. The vertically stacked gate-all-around GAA semiconductor device as claimed in claim 1, wherein the first FET GAA device is an nFET GAA device, said crystalline orientation of said nFET GAA device is a (100) dominant plane and a (110) sidewall orientation; and
   the second FET GAA device is an pFET GAA device, said crystalline orientation of said pFET GAA device is a (110) dominant plane and a (100) sidewall orientation.

3. The vertically stacked gate-all-around GAA semiconductor device as claimed in claim 1, wherein the first FET GAA device is a pFET GAA device, said crystalline orientation of said pFET GAA device is a (110) dominant plane and a (100) sidewall orientation; and
   the second FET GAA device is an nFET GAA device, said crystalline orientation of said nFET GAA device is a (100) dominant plane and a (110) sidewall orientation.

4. The vertically stacked gate-all-around GAA semiconductor device as claimed in claim 1, wherein said first vertical stack of spaced apart nanosheet channels have sidewall surfaces and said second vertical stack of spaced apart nanosheet channels have sidewall surfaces, said sidewall surfaces of said first vertical stack and second vertical stack of spaced apart nanosheet channels being one of: self-aligned, or not self-aligned.

5. The vertically stacked gate-all-around GAA semiconductor device as claimed in claim 2, wherein said nFET GAA device comprises:
   a substrate, a first insulator material bonding layer disposed on the substrate and the first vertical stack of spaced apart nanosheet channels being suspended above the first insulator material bonding layer;
   a source region disposed in communication with a first end of each suspended nanosheet channel of the first vertical stack;

a drain region disposed in communication with a second end of each suspended nanosheet channel of the first vertical stack, the first gate structure positioned substantially transverse to each suspended nanosheet channel of the first vertical stack, the first gate structure surrounding a portion of each suspended nanosheet channel of the first vertical stack between the source region and the drain region; and a layer of high-k dielectric material surrounding each suspended nanosheet channel of the first vertical stack between the source region and the drain region, each respective surrounding layer of high-k dielectric material disposed between the first gate structure and a respective nanosheet channel.

6. The vertically stacked gate-all-around GAA semiconductor device as claimed in claim 2, wherein the second vertical stack of spaced apart nanosheet channels are suspended above the insulator material bonding layer, said pFET GAA device comprising:

a source region disposed in communication with a first end of each suspended nanosheet channel of the second vertical stack;

a drain region disposed in communication with a second end of each suspended nanosheet channel of the second vertical stack;

the second gate positioned substantially transverse to each suspended nanosheet channel of the second stack, the second gate structure surrounding a portion of each suspended nanosheet channel of the second stack between the source region and the drain region; and a layer of high-k dielectric material surrounding each suspended nanosheet channel of the second vertical stack between the source region and the drain region, each respective surrounding layer of high-k dielectric material disposed between the second gate structure and a respective nanosheet channel.

7. A method of forming a vertically stacked gate-all-around (GAA) semiconductor device, the method comprising:

forming on a first wafer with a first crystal orientation a first layered material structure for forming a first vertical stack of spaced apart nanosheet channel material layers;

forming on a second wafer with a second crystal orientation a second layered material structure for forming a second vertical stack of spaced apart nanosheet channels;

bonding said first wafer to said second wafer to form a bonded wafer;

building a first GAA transistor device including the first vertical stack of spaced apart nanosheet channel material layers surrounded by a first gate structure;

flipping the bonded wafer; and building a second GAA transistor device including the second vertical stack of spaced apart nanosheet channel material layers surrounded by a second gate structure.

8. The method as claimed in claim 7, wherein the first layered material structure includes a first insulator material bonding layer on a top surface thereof and the second layered material structure includes a second insulator material bonding layer on a top surface thereof, said first and second wafer bonding comprising bonding said first insulator material bonding layer to the second insulator material bonding layer to form a bonding material layer.

9. The method as claimed in claim 7, wherein said first wafer is a silicon-on-oxide (SOI) structure having a substrate and an oxide layer, said building said first GAA transistor device comprising:

removing said substrate and oxide layer to expose a surface of said first layered material structure; and etching portions of said first layered material structure to form said first vertical stack of spaced apart nanosheet channel material layers having exposed sidewalls.

10. The method as claimed in claim 9, wherein said building said first GAA transistor device further comprises:

forming a dielectric material layer to surround a top surface and exposed sidewall surfaces of said formed first vertical stack of spaced apart nanosheet channel material layers;

forming a dummy gate structure above said formed dielectric material layer;

forming a source region at one end and a drain region at an opposite end of said formed first vertical stack of spaced apart nanosheet channel material layers; and removing said formed dummy gate structure and dielectric material layer to expose surfaces of said first vertical stack of spaced apart nanosheet channel material layers between said formed source and drain regions.

11. The method as claimed in claim 10, wherein said first vertical stack of spaced apart nanosheet channel material layers comprise alternating semiconducting material and dielectric material layers, said method further comprising:

removing alternating layers of said dielectric material layers to suspend remaining vertically stacked spaced apart semiconducting material layers between said formed source region and drain region, said remaining vertically stacked spaced apart semiconducting material layers having exposed top surface, bottom surface and sidewall surfaces, and said removing further resulting in exposing a first surface of said bonding material layer;

forming a high-k dielectric material layer above the exposed first surface of said bonding material layer, said high-k dielectric material layer further surrounding said exposed top surface, bottom surface and sidewall surfaces of said remaining suspended vertically stacked spaced apart semiconducting material layers;

forming the first gate structure on top of said high-k dielectric material layer above said first surface of said bonding material layer and said first gate structure extending to surround each said high-k dielectric material layer surrounding each top surface, bottom surface and sidewall surfaces of said remaining suspended vertically stacked spaced apart semiconducting material layers; and forming a further insulator material bonding layer above a top surface of said formed first gate structure.

12. The method as claimed in claim 11, wherein said second wafer is a silicon-on-oxide (SOI) structure having a substrate and an oxide layer, said building said second GAA transistor device comprising:

flipping said bonded wafer to bond said further insulator material bonding layer to an insulator material bonding layer formed on a semiconductor substrate surface of a third wafer;

removing said substrate and oxide layers of said second wafer;

etching portions of said second layered material structure to form said second vertical stack of spaced apart nanosheet channel material layers having exposed sidewalls;

forming a dielectric material layer to surround a top surface and exposed sidewall surfaces of said formed second vertical stack of spaced apart nanosheet channel material layers;

forming a dummy gate structure above said formed dielectric material layer;

forming a source region at one end and a drain region at an opposite end of said formed second vertical stack of spaced apart nanosheet channel material layers; and removing said formed dummy gate structure and dielectric material layer to expose surfaces of said second vertical stack of nanosheet channel material layers between said formed source and drain regions.

13. The method as claimed in claim 12, wherein said second vertical stack of nanosheet channel material layers comprise alternating semiconducting material and dielectric material layers, said method further comprising:

removing alternating layers of said dielectric material layers to suspend remaining vertically stacked spaced apart semiconducting material layers between said formed source region and drain region, said remaining vertically stacked spaced apart semiconducting material layers having exposed top surface, bottom surface and sidewall surfaces, and said removing further resulting in exposing a second surface of said bonding material layer;

forming a high-k dielectric material layer above the exposed second surface of said bonding material layer, said high-k dielectric material layer further surrounding said exposed top surface, bottom surface and sidewall surfaces of said remaining suspended vertically stacked spaced apart semiconducting material layers;

forming the second gate structure on top of said high-k dielectric material layer above said second surface of said bonding material layer and said second gate structure extending to surround each said high-k dielectric material layer surrounding each top surface, bottom surface and sidewall surfaces of said remaining suspended vertically stacked spaced apart semiconducting material layers.

14. The method as claimed in claim 9, further comprising:

continuing etching portions of said formed bonding material layer and portions of said second layered material structure to form said second vertical stack of spaced apart nanosheet channel material layers having exposed sidewalls self-aligned with said exposed sidewalls of said first vertical stack of spaced apart nanosheet channel material layers and further self-aligned with sidewalls of a remaining non-etched portion of said bonding material layer.

15. The method as claimed in claim 14, further comprising:

depositing a dielectric material to surround opposing exposed self-aligned sidewall surfaces of said formed first vertical stack of spaced apart nanosheet channel material layers, said second vertical stack of spaced apart nanosheet channel material layers and said further self-aligned sidewalls of the remaining non-etched portion of said bonding material layer;

removing portions of said dielectric material to expose the first vertical stack of spaced apart nanosheet channels; and forming, using a Replacement Metal Gate (RMG) process flow, a dummy metal gate structure to surround said first vertical stack of spaced apart nanosheet channels.

16. The method as claimed in claim 15, wherein said building said second GAA transistor device comprises:

flipping over said bonded first wafer and second wafer;

removing said substrate and oxide layers of said second wafer;

removing further portions of said dielectric material to expose the second vertical stack of spaced apart nanosheet channels; and forming, using the RMG process flow, a dummy metal gate structure to surround said second vertical stack of spaced apart nanosheet channels.

17. The method as claimed in claim 16, further comprising:

replacing said dummy metal gate structure surrounding said second vertical stack of spaced apart nanosheet channels with a gate structure comprising a first work function metal material.

18. The method as claimed in claim 17, further comprising:

flipping over said bonded first wafer and second wafer; and replacing said dummy metal gate structure surrounding said first vertical stack of spaced apart nanosheet channels with a gate structure comprising a second work function metal material.

19. The method as claimed in claim 17, wherein on of:

said first work function metal is a valence band edge work function metal and said second work function metal is a conduction band edge work function metal; or said first work function metal is a conduction band edge work function metal and said second work function metal is a valence band edge work function metal.

20. A vertically stacked gate-all-around (GAA) semiconductor device comprising:

a first FET GAA device having a first vertical stack of spaced apart nanosheet channels surrounded by a first gate, the first vertical stack of nanosheet channels comprising a first channel material, wherein the first channel material comprises a first crystalline orientation;

an insulator material bonding layer disposed above said first gate; and a second FET GAA device having a second vertical stack of nanosheet channels surrounded by a second gate, said second FET GAA device formed on top said insulator material bonding layer, the second vertical stack of nanosheet channels comprising a second channel material, wherein the second channel material comprises a second crystalline orientation and the first crystalline orientation is different from the second crystalline orientation.

21. The vertically stacked gate-all-around (GAA) semiconductor device of claim 20, wherein said first vertical stack of spaced apart nanosheet channels have sidewalls self-aligned to sidewalls of said second vertical stack of spaced apart nanosheet channels.

22. A method of forming a vertically stacked gate-all-around (GAA) semiconductor device, the method comprising:

bonding a first semiconductor wafer to a second semiconductor wafer;

building, on said bonded first wafer, a first FET GAA device having a first vertical stack of spaced apart nanosheet channels surrounded by a first gate, the first vertical stack of spaced apart nanosheet channels comprising a first channel material, wherein the first channel material comprises a first crystalline orientation;

flipping over said bonded first wafer and second wafer;

building on said bonded second wafer, a second FET GAA device having a second vertical stack of nanosheet channels surrounded by a second gate, said second vertical stack of spaced apart nanosheet channels having sidewalls self-aligned to sidewalls of said first vertical stack of spaced apart nanosheet channels, the second vertical stack of spaced apart nanosheet channels comprising a second channel material, wherein the second channel material comprises a second crystalline orientation and the first crystalline orientation is different from the second crystalline orientation.

23. The method as claimed in claim 22, wherein said building on said bonded first wafer said first FET GAA device having the first vertical stack of spaced apart nanosheet channels surrounded by a first gate comprises:

forming a vertical stack comprising the first vertical stack of spaced apart nanosheet channels above the second vertical stack of second spaced apart nanosheet channels, said second vertical stack of spaced apart nanosheet channels having sidewalls self-aligned to sidewalls of said first vertical stack of spaced apart nanosheet channels;

depositing a dielectric material to surround opposing self-aligned sidewalls of said formed vertical stack;

removing portions of said dielectric material to expose the first vertical stack of spaced apart nanosheet channels;

forming, using a Replacement Metal Gate (RMG) process flow, a dummy metal gate structure to surround said first vertical stack of spaced apart nanosheet channels, said method further comprising:

flipping over said bonded first wafer and second wafer and building, on said bonded second wafer, said second FET GAA device having the second vertical stack of spaced apart nanosheet channels surrounded by a second gate, said building said second FET GAA device having the second vertical stack of spaced apart nanosheet channels surrounded by a second gate comprising:

forming, using the RMG process flow, a dummy metal gate structure to surround said second vertical stack of spaced apart nanosheet channels, replacing said dummy metal gate structure surrounding said second vertical stack of spaced apart nanosheet channels with a gate structure comprising a first work function metal material;

flipping over said bonded first wafer and second wafer; and replacing said dummy metal gate structure surrounding said first vertical stack of spaced apart nanosheet channels with a gate structure comprising a second work function metal material.

24. The method as claimed in claim 22, wherein said building, on said bonded first wafer, said first FET GAA device having the first vertical stack of spaced apart nanosheet channels comprises:

forming a vertical stack comprising the first vertical stack of spaced apart nanosheet channels above the second vertical stack of second spaced apart nanosheet channels, said second vertical stack of spaced apart nanosheet channels having sidewalls self-aligned to sidewalls of said first vertical stack of spaced apart nanosheet channels;

depositing a dielectric material to surround opposing self-aligned sidewalls of said formed vertical stack;

removing portions of said dielectric material to expose the first vertical stack of spaced apart nanosheet channels;

forming a metal gate structure with a first work function metal material to surround said exposed first vertical stack of spaced apart nanosheet channels using a Replacement Metal Gate (RMG) process flow;

flipping over said bonded first wafer and second wafer to build, on said bonded second wafer, said second FET GAA device having the second vertical stack of spaced apart nanosheet channels, said building, on said bonded second wafer, said second FET GAA device having the second vertical stack of spaced apart nanosheet channels surrounded by the second gate comprising:

removing further portions of said dielectric material to expose the second vertical stack of spaced apart nanosheet channels;

forming a metal gate structure with a second work function metal material to surround said second vertical stack of spaced apart nanosheet channels using the RMG process flow.

\* \* \* \* \*